United States Patent [19]
El Gamal et al.

[11] Patent Number: 4,910,417
[45] Date of Patent: Mar. 20, 1990

[54] UNIVERSAL LOGIC MODULE COMPRISING MULTIPLEXERS

[75] Inventors: Abbas El Gamal, Palo Alto; Khaled A. El-Ayat, Cupertino; Jonathan W. Greene, Palo Alto; Ta-Pen R. Guo, Cupertino, all of Calif.

[73] Assignee: Actel Corporation, Sunnyvale, Calif.

[21] Appl. No.: 293,645

[22] Filed: Jan. 5, 1989

Related U.S. Application Data

[60] Division of Ser. No. 195,728, May 3, 1988, which is a continuation-in-part of Ser. No. 909,261, Sep. 19, 1986, Pat. No. 4,758,745.

[51] Int. Cl.$^4$ .......................................... H03K 19/094
[52] U.S. Cl. ..................................... 307/465; 307/243; 307/303.2; 307/448; 307/468
[58] Field of Search ............... 307/443, 448, 465, 468, 307/469, 475, 241-243, 584, 303; 340/825.85-825.91

[56] References Cited

U.S. PATENT DOCUMENTS

| 4,354,266 | 10/1982 | Cooperman et al. | 307/243 X |
|---|---|---|---|
| 4,453,096 | 6/1984 | Le Can et al. | 307/448 |
| 4,551,634 | 11/1985 | Takahashi et al. | 307/243 |
| 4,558,236 | 12/1985 | Burrows | 307/448 X |
| 4,577,124 | 3/1986 | Koike | 307/448 X |
| 4,620,117 | 10/1986 | Fang | 307/443 X |
| 4,684,829 | 8/1987 | Uratani | 307/443 X |
| 4,710,649 | 12/1987 | Lewis | 307/448 X |

Primary Examiner—David Hudspeth
Attorney, Agent, or Firm—Lyon & Lyon

[57] ABSTRACT

A user-programmable interconnect architecture, which may be used for logic arrays for digital and analog system design, is disclosed. In one embodiment, a plurality of logic cells or modules in a matrix are connected by vertical and horizontal wiring channels. The wiring channels may in turn be programmed by the user to interconnect the various logic cells to implement the required logic function. The wiring channels comprise wiring segments connected by normally open programmable elements situated at the intersection of any two segments to be connected. Sensing circuitry and wiring may be included to allow 100% observability of internal circuit nodes, such as module outputs, from an external pad interface. A universal function module may be configured to implement the popular logic functions and has a physical layout which is conductive to custom circuit design.

5 Claims, 19 Drawing Sheets

| LOGIC FUNCTIONS TO BE REALIZED | UNIVERSAL MODULE | | | | |
|---|---|---|---|---|---|
| | INPUT CONNECTIONS | | | OUTPUTS | |
| | S | A | B | $\overline{Q}$ | Q |
| NAND / AND | X | Y | '0' | $\overline{X \cdot Y}$ | $X \cdot Y$ |
| NOR / OR | X | '1' | Y | $\overline{X+Y}$ | $X+Y$ |
| XNOR / XOR | X | $\overline{Y}$ | Y | $X \cdot Y + \overline{X} \cdot \overline{Y}$ | $X \cdot \overline{Y} + \overline{X} \cdot Y$ |
| SR / LATCH | $\overline{Q}$ | S | $\overline{R}$ | $\overline{Q}$ | Q |
| D / LATCH | L | D | Q | $\overline{Q}$ | Q |

FIGURE 2C

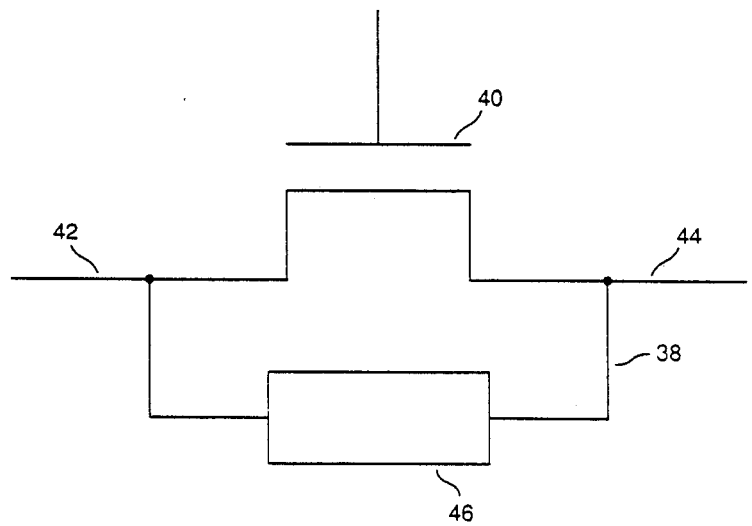

FIGURE 3

| FUNCTION | EQUATION | $A_0$ | $A_1$ | $B_0$ | $B_1$ | $S_a$ | $S_1$ | $S_0$ | $S_b$ |
|---|---|---|---|---|---|---|---|---|---|
| NAND | $Y = \overline{(A \cdot B)}$ | 1 | 1 | 0 | 1 | A | 0 | B | A |
|  |  | 0 | 1 | 0 | 1 | 0 | 0 | B | A |
|  |  | 0 | 1 | 0 | 1 | 0 | B | 0 | A |
|  |  | 0 | 1 | 0 | 1 | 0 | 0 | A | B |
| NOR | $Y = \overline{(A+B)}$ | 0 | 1 | 0 | 0 | A | B | 0 | A |
|  |  | 0 | 1 | 0 | 0 | 0 | B | A | 0 |
|  |  | 0 | 1 | 0 | 0 | B | 0 | A | 0 |
|  |  | 0 | 1 | 0 | 0 | 0 | A | B | 0 |
| AND | $Y = A \cdot B$ | 0 | 0 | 0 | 0 | 0 | 0 | B | A |
|  |  | 0 | 0 | 0 | 0 | 0 | B | 0 | A |
|  |  | 0 | 0 | 0 | 0 | 0 | 0 | A | B |
|  |  | 0 | 0 | 0 | 0 | 0 | 0 | A | 1 |
| OR | $Y = A+B$ | 0 | 0 | 1 | 0 | 0 | 1 | B | A |
|  |  | 0 | 0 | 1 | 0 | 0 | B | 0 | A |
|  |  | 1 | 0 | 1 | 0 | 0 | 0 | A | B |
|  |  | 0 | 0 | B | 0 | B | 0 | B | 1 |
| XOR | $Y = (A \cdot \overline{B}) + (B \cdot \overline{A})$ | 1 | 0 | 0 | 1 | A | 1 | B | A |
|  |  | 1 | 0 | 0 | 1 | A | B | 0 | A |
| MAJ | $Y = A \cdot B + B \cdot C + A \cdot C$ | C | 0 | 1 | C | A | 0 | B | A |
|  |  | B | 0 | 1 | B | A | 0 | C | A |
|  |  | C | 0 | 1 | C | A | B | 0 | A |
|  |  | B | 0 | 1 | B | B | C | 0 | B |
|  |  | A | 0 | 1 | A | A | C | 0 | B |
| LATCH | $Q = \overline{CLR}(CLK \cdot D + Q \cdot \overline{CLK})$ | Q | 0 | D | 0 | CLR | CLK | 0 | CLR |
|  |  | Q | 0 | CLR | 0 | CLR | CLK | 0 | D |

FIGURE 2G

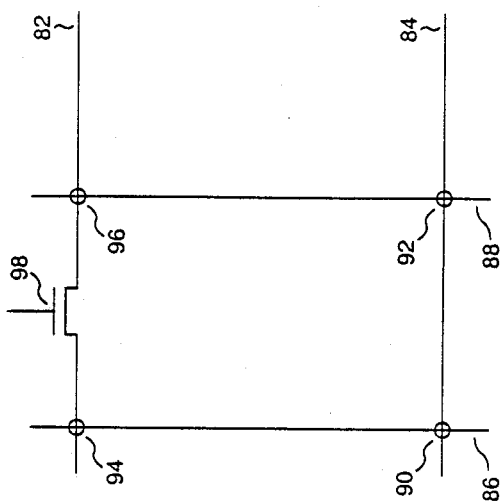
FIGURE 7E
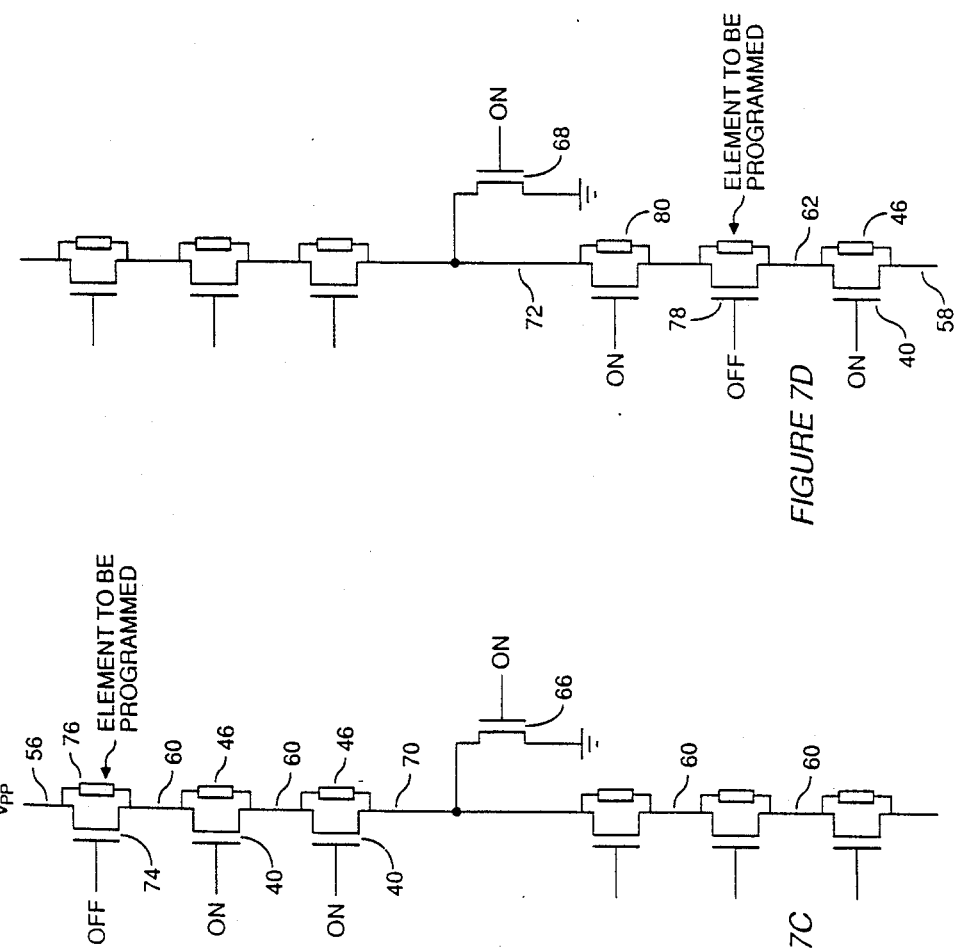
FIGURE 7D
FIGURE 7C

UNIVERSAL LOGIC MODULE COMPRISING MULTIPLEXERS

This application is a divisional application of application Ser. No. 195,728, filed May 3, 1988 which is a continuation in part of copending application Ser. No. 909,261, filed Sept. 19, 1986, assigned to the same assignee as the present invention now U.S. Pat. No. 4,758,745.

BACKGROUND OF THE INVENTION

1. Field of the Invention

The present invention relates to integrated circuit (IC) technology. More specifically, the present invention pertains to user-configurable interconnections for array logic and other circuitry.

2. The Prior Art

An integrated circuit uses a network of metal interconnects between the individual semiconductor components which are patterned with standard photolithographic processes during wafer fabrication. Multiple levels of metalized patterns may be used to increase the flexibility of the interconnects. For example, in Very Large Scale Integration (VLSI) circuits, higher density and more complex wiring networks are needed.

It has long been recognized that a user-programmable interconnect technique or manufacturer programmability just prior to shipment would allow lower tooling costs and faster delivery time. One technique to accomplish this uses lasers to make or break pre-patterned metal interconnects between an array of logic cells. This is usually performed on the finished wafer prior to assembly or actually in an open package. Another approach uses an array of uncommitted interconnect metal lines using anti-fuses consisting of an amorphous silicon alloy sandwiched into insulation holes between third and fourth metal layers to provide electrically programmable links.

Such systems of interconnect may be used in analog or digital integrated circuits fabricated using bipolar, MOS or other semiconductor technologies. The laser approach requires sophisticated programming equipment and is fairly slow, requiring many hours to pattern one device having a complexity of two to three thousand circuit elements. Various techniques for electrically-programmable interconnects suffer from three major problems: the architectural approaches are not silicon efficient; the connectivity is inflexible; and the speed performance is degraded.

A gate array circuit is an array of uncommitted gates with uncommitted wiring channels. To implement a particular circuit function, the circuit is mapped into the array and the wiring channels, and appropriate connections are mask programmed by the IC gate array vendor to implement the necessary wiring connections that form the circuit function. The gate array vendor then fabricates the circuit according to the constructed masks. Gate arrays are therefore mask programmable and not user programmable.

User-programmable logic arrays are widely used in digital system design in implementing many logic functions and replacing transistor-transistor logic (TTL) parts. Logic arrays currently available include PLA (Programmable Logic Arrays), FPLAs (Field Programmable Logic Arrays), EPLDs (Erasable Programmable Logic Devices) and logic cell arrays using RAM (Random Access Memory) cells to define logic cell function and interconnect configuration. Programmable logic circuit arrays have been usually implemented in bipolar technology using fusible links which, when programmed, define the logic function to be implemented. An example of such a link is the polysilicon fuse which is "programmed" when it is blown and prevents current flow in a circuit. Such fusible links often require large current to operate and require extra area on the IC. More recently, electrically programmable read-only memory (EPROM) and electrically erasable read-only memory (EEROM) technology has been used to construct programmable logic circuit arrays. In the latter case, EPROM or EEROM cells are programmed and the stored values used to define circuit configuration.

Existing programmable array logic circuits use an AND plane of gates followed by an OR plane of gates to implement a particular logic function. The AND plane is usually user-programmable, while the OR plane programming is usually fixed. Variations of this architecture include registered outputs for the OR plane, partitioning of the array into smaller AND/OR arrays or macrocells, and programmable input/output (I/O) architecture to implement several options of I/O requirements. The RAM-implemented logic cell array consists of a matrix of configurable blocks which are programmed to implement a particular logic function by loading an internal RAM with the appropriate data pattern. The array has a network of user-programmable MOS transistors acting as electrical switches as well as vertical and horizontal lines or wires to connect the logic blocks together and to the I/O blocks.

Existing user-programmable array logic circuits described above are useful in implementing certain logic functions but have several disadvantages. First, the use of an AND plane/ OR plane combination of gates to implement logic functions is inflexible and is not well suited to the requirements of random logic functions. Second, the utilization factor of such an array is quite low and a large number of gates are wasted. Third, the IC chip area-per-functional capability is usually quite high.

Gate arrays, on the other hand, are more flexible than programmable array logic and much more efficient in their gate utilization and IC chip area utilization. However, their main disadvantage is that they are mask programmable and not user programmable This results in much higher costs to develop the circuit and its unique mask patterns, and a long turn-around time to order and receive IC chips.

The RAM-implemented logic cell array offers more flexibility than the above programmable circuits due to the nature of the array, its logic blocks, and the interconnect capability. However, it has several disadvantages. First, the interconnect method uses MOS memory transistors that are costly in area, slow down the performance and are volatile as they will deprogram when power is disconnected. Additionally, the use of RAM cells to define the logic block function, its architecture and interconnect scheme is very inefficient in area utilization and must be loaded from other non-volatile memory devices.

OBJECTS OF THE INVENTION

An object of the invention is to provide a user-programmable circuit with a flexible interconnect architecture that allows the implementation of field-programmable semi-custom ICs with high complexity and performance.

An additional object of the invention is to provide an array logic circuit which is more flexible than existing programmable logic circuits, more efficient in IC area utilization, more efficient in gate utilization, and allows 100% observability of any internal logic node from the external pad interface.

It is also an object of the invention to provide a user programmable array logic circuit that provides the same capabilities and versatility as mask programmed gate arrays with comparable performance characteristics. Other objects and features of the invention will become apparent to those skilled in the art in light of the following description and drawings of the preferred embodiment.

BRIEF DESCRIPTION OF THE INVENTION

In accordance with the present invention, a user programmable interconnect architecture is disclosed. Many kinds of electrical components or elements, which will here be generally referred to as "modules," may be interconnected by this architecture. One logic implementation of the user programmable interconnected architecture consists of a plurality of logic cells or logic modules placed in an array or matrix. The array has a set of vertical wiring channels and a set of horizontal wiring channels which are programmed by the user to interconnect the various logic cells to implement the required logic functions. Additional sensing circuitry and wiring is included to allow 100% observability of internal circuit nodes, such as logic cell outputs, from the external pad interface. This is accomplished by a addressable virtual probe which provides access to any internal test point in the array.

Connections to the wiring channels are made by a normally-open programmable element situated at the intersection of any two wires to be connected. To make a connection, the programmable element is programmed, resulting in a permanent low-impedance electric connection between the two wires. To provide more efficient utilization of the wiring channels, a plurality of these programmable elements may be used to segment the vertical and horizontal channels into shorter wire lengths. These segments may be joined together to form longer wire connections by programming the programmable elements or left as is to provide independent segment wire lengths and allow the same wiring channel position to be used several times for different circuit connections.

Programming circuitry is situated at the edge of the array. Programming and connectivity information is shifted into the programming circuit, and appropriate voltages applied to effect the desired connection patterns. The same vertical and horizontal channels that are used for wiring channels in normal operations may be used for programming the various interconnections and to provide complete testing of the array modules and wiring paths The logic cell used in the array is a universal element, and is very efficient in its implementation of random logic functions which are defined by the use of selected programmable elements.

Further, additional circuitry is included to allow 100% observability of any internal test point, such as logic cell or module outputs, thus providing a user-moveable probe inside the integrated circuit to test internal points from the external interface without having to actually physically probe the internal circuits.

Those skilled in the art will recognize the general applicability of the interconnect architecture disclosed herein to other types of circuits, both analog and digital.

BRIEF DESCRIPTION OF THE DRAWINGS

FIG. 1b is an example of a more detailed block diagram of the program, test and I/O circuitry of FIG. 1a.

FIG. 2c is a table showing the input and output connections to be used for the circuit of FIG. 2b to implement popular logic functions.

FIG. 2g is a table showing the configuration of the inputs and outputs of the module of FIG. 2f to implement popular logic functions.

FIG. 3 is a schematic diagram of a programmable interconnect element shunted by its associated series-pass transistor for use in a preferred embodiment of the present invention.

FIGS. 7a–7i further illustrate the channel wiring and segmentation techniques of the present invention by showing several programming examples of different connection requirements.

DESCRIPTION OF PREFERRED EMBODIMENT

Figure 1A:
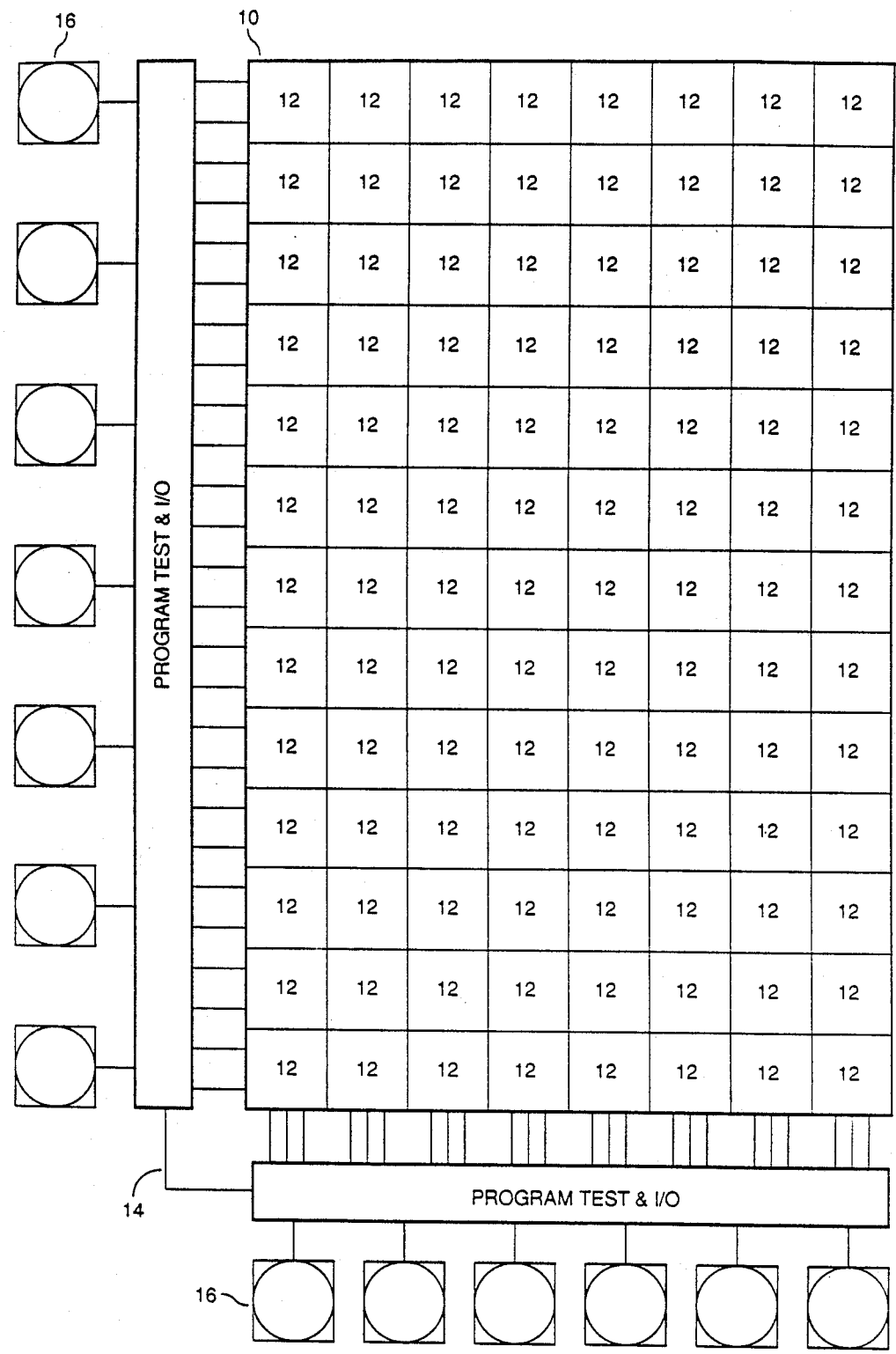
FIG. 1a is a block diagram of a preferred embodiment of a user-programmable gate array according to the present invention.

Referring first to FIG. 1a, a block diagram of one embodiment of the user programmable array circuit, one may see that the circuit contains an array block 10 organized into columns and rows of individual circuit modules 12; the program, test, and input/output (I/O) blocks 14 and the I/O pads 16. The number of columns or rows of modules 12 may be chosen to accommodate the desired array size. The program, test, and I/O blocks 14 are used to program all the required vertical and horizontal connections in the array, test the array logic and wiring channels, provide connections between the I/O pads and the array circuitry, and provide a mechanism to select any internal node as a test point to be observed from the I/O pads 16.

Figure 1B:
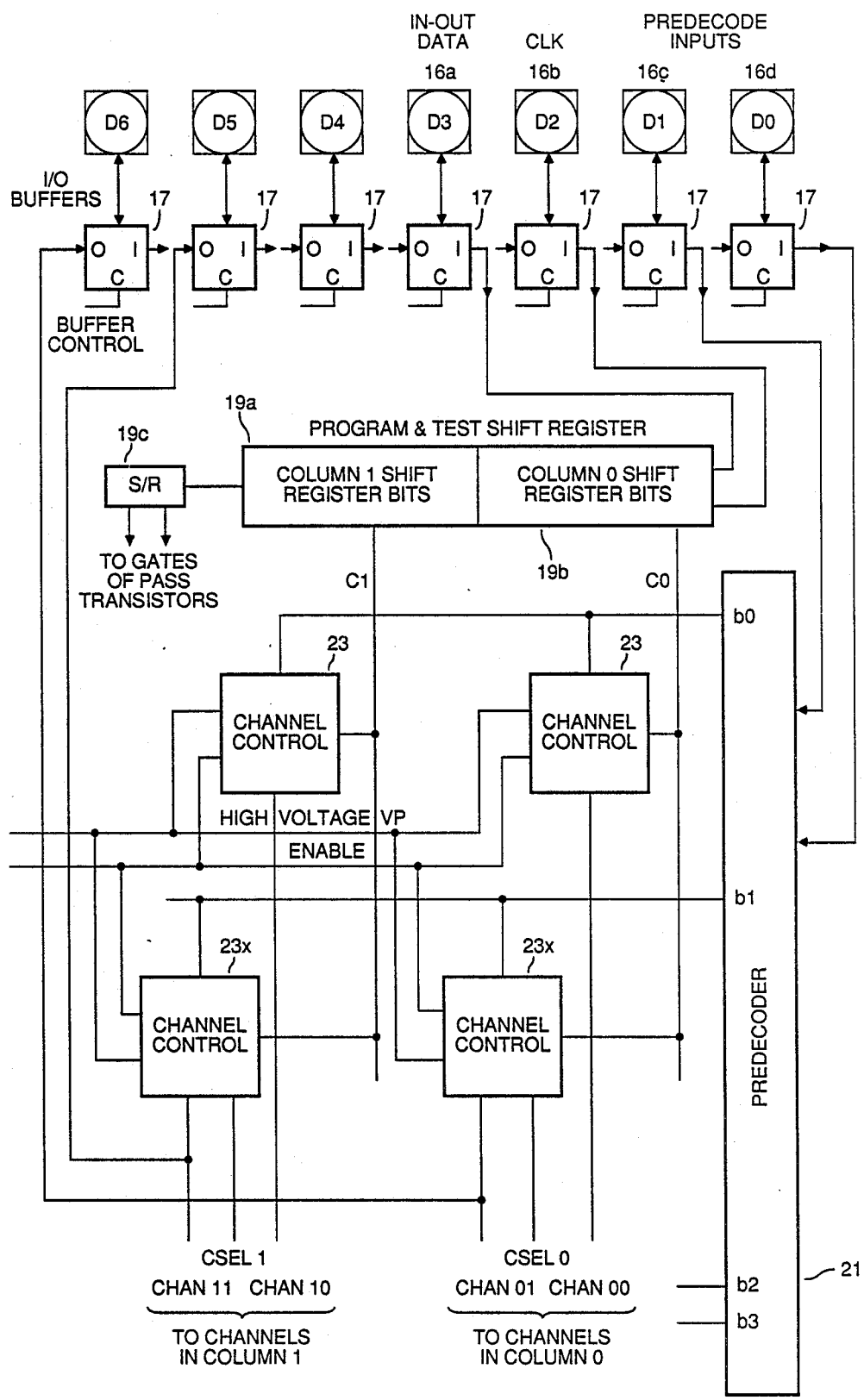

A preferred embodiment of the program, test and I/O logic 14 is shown in FIG. 1b. The figure illustrates how the circuit is used to program a plurality of channels using the example of channels situated in two different columns to explain circuit functionality. From the example illustrated in FIG. 1b, those of ordinary skill in the art will readily understand how any number of channels and columns can be programmed.

In order to select a particular channel for programming, a unique data pattern must be supplied to the circuit. The data pattern is supplied to the circuit via the I/O pads, illustrated in FIG. 1b at 16a, 16b, 16c, and 16d, respectively. The data pattern may be partitioned into two parts, a serial bit field and a parallel address selection field. Referring to FIG. 1b, the serial field is shifted into the circuit using I/O pad 16a. The clock signal needed to control the shifting of the data is supplied by I/O pad 16b. All I/O pads connect to I/O buffers 17, which may be bidirectional buffers as will be well understood by those skilled in the art.

Each Input/Output buffer 17 has the following connections: a connection to the pad, an input port I and an output port 0 and a buffer control input C to configure the Input/Output buffer as input, output or tri-state. Buffer control signals are appropriately generated from logic module outputs and internal control circuitry, which is needed during the different operating modes of the chip such as program mode, test mode, and normal mode.

Shifting of the serial input data is accomplished by shift registers 19. Shift control of the serial sequences may be performed by either on-chip or external circuitry. In the example illustrated in FIG. 1b, two stages of the shift registers 19a and 19b are shown, one shift stage per column. After loading, each shift stage contains the necessary data to control any channel within that column.

A parallel address field, also known as the predecoder (two bits wide in this example) is also supplied to the circuit by two I/O pads 16c and 16d. This field is then decoded by the 2:4 predecoder 21 having outputs $b_0$–$b_3$. Together the bits from shift registers 19a and 19b and the outputs of predecoder 21 uniquely specify the channel to be controlled for programming. Programming control is implemented by the channel control logic units 23, which act as local decoders as well as voltage controllers for the channels. Each channel control logic unit 23, depending on the states of its inputs, is capable of driving its associated channel to Vpp (program voltage), GND, Vcc, or a tri-stator intermediate voltage to prevent programming. Those of ordinary skill in the art will readily recognize that channel control logic units 23 may be configured using standard transistor switching circuitry.

The predecoder 21 illustrated in FIG. 1b in this implementation is a 2:4 decoder. Outputs b2 and b3 are shown unconnected but they would normally connect to other channel control logic units (not shown) to control more channels. The predecoder size and number of bits per shift register stage are arbitrary and are selected so that their combination is capable of uniquely selecting a channel control block, and they result in an efficient use of silicon space.

During programming, the circuit illustrated in FIG. 1b operates as follows. Input data, representing channels to be programmed, is shifted into shift registers 19a and 19b by a shift clock input appearing at I/O pad 16b. Pre-decode inputs are presented to I/O pads 16c and 16d, and through I/O buffers 17 to pre-decoder 21. Assume that the inputs on I/O 16c and 16d have caused the b0 output of pre-decoder 21 to become active low. Assume further, that output Co from shift register 19b is true and that the output Cl from register 19a is false, indicating that channel 00 is to be programmed and channel 10 is not to be programmed. Combination of the active low b0 signal and the true Co signal on channel control unit 23b, in conjunction with the enable signal, indicating that programming is to take place, causes the programming voltage Vpp to appear on the channel 00 line. Channel control unit 23a, however, has a false signal on line Cl coming from shift register 19a so even in the presence of the active low b0 signal and the enable signal the programming voltage Vpp is not enabled onto the channel 10 line. Instead an intermediate voltage is applied to that channel so that no programming connection is made to that channel.

From the above description, it is seen readily by those of ordinary skill in the art how an array of virtually any size may be programmed, by using such programming circuitry at appropriately selected sections of the array.

Figure 2A:
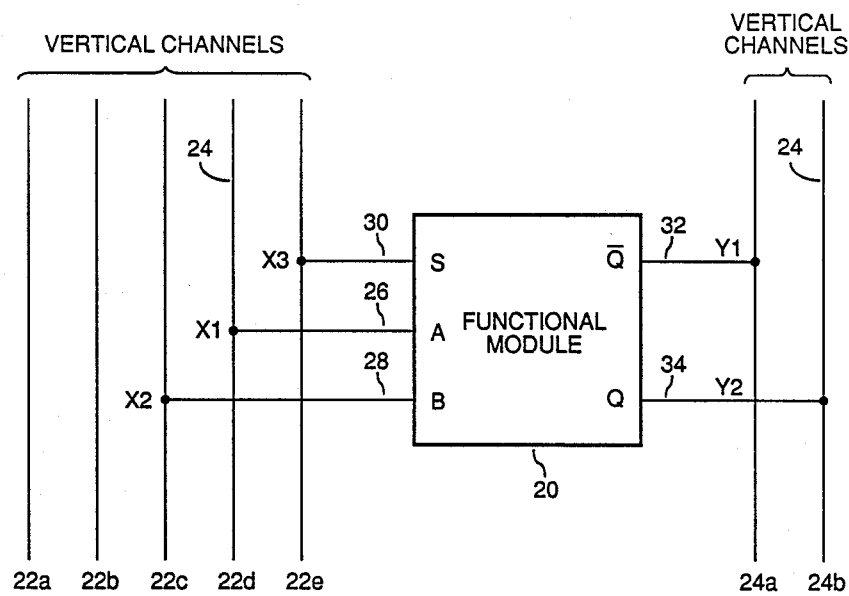
FIG. 2a is a block diagram of a preferred embodiment of a logic array module and its associated vertical and horizontal wiring channels according to the present invention.
Figure 2B:
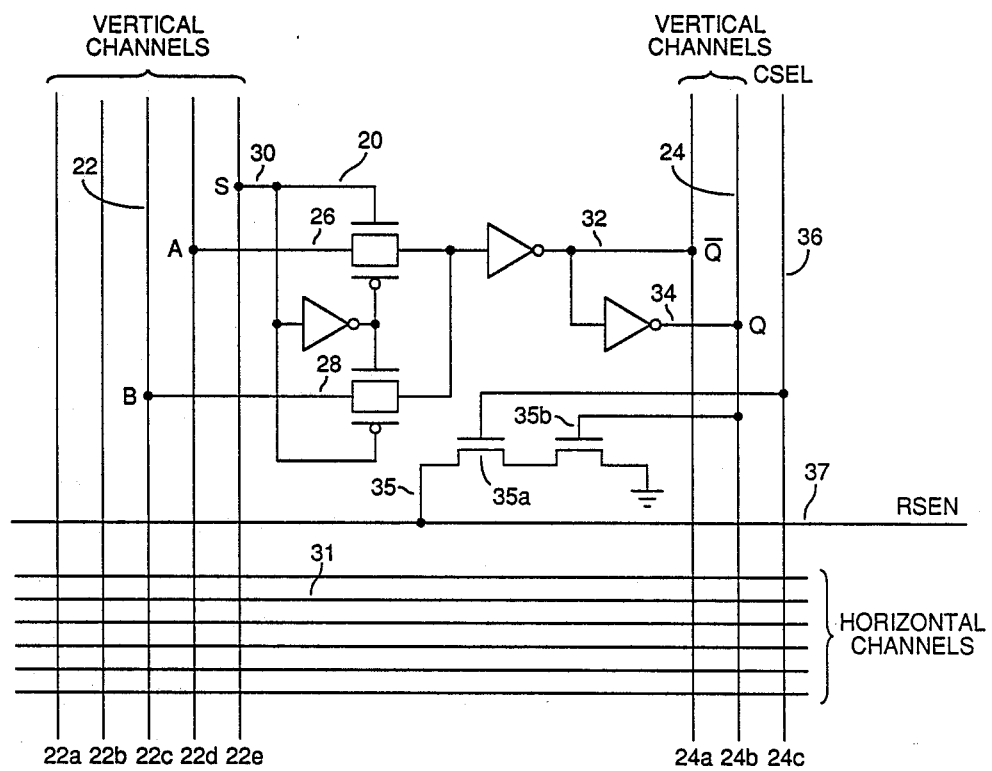
FIG. 2b is a logic diagram of the logic array module of FIG. 2a, showing connections to the horizontal and vertical wiring channels.

The individual circuit module 12 is shown in block diagram forms in FIGS. 2a and 2b. Referring first to FIG. 2a, each individual circuit module 12 comprises a functional circuit module, designated generally as 20 and vertical wiring channels generally designated 22 and 24. (The terms "vertical" and "horizontal" are terms chosen to conveniently describe the wiring channels as they appear in the drawings; no necessary relation to the actual directions is to be implied.) The vertical wiring channels 22 are wire segments joined by programmable elements, as will be described below. Functional circuit module 20 has its A input terminal 26, its B input terminal 28, and its S input terminal 30 connected to vertical channels 22d, 22c and 22e, respectively, and its $\overline{Q}$ output terminal 32 and Q output terminal 34 connected to vertical channels 24a and 24b, respectively. X1, X2, and X3, refer to the inputs of input terminals A, B, and S; Y1 and Y2 refer to the outputs of output terminals $\overline{Q}$ and Q.

Those of ordinary skill in the art will recognize the a programmable array architecture configured according to the present invention may have different types of array modules as well as combinations of two or more types of modules. Further, portions of the array may be replaced by large circuit blocks or megacells such as random access memory (RAM), read only memory (ROM), multiplier, and arithmetic logical units (ALU) optimized to implement certain functions. In addition, such an array may have a varying number of vertical and horizontal wiring channels.

Referring now to FIG. 2b, functional circuit module 20 will be described. In a presently-preferred embodiment, functional circuit module 20 is a universal logic module having 5 terminals: 3 input and 2 output. Input terminals A, B, and S are shown at 26, 28 and 30 respectively. Output terminals $\overline{Q}$ and Q are shown at 32 and 34 respectively.

The cell's function is a 2:1 multiplexor and provides both the true and complement value of the function. This logic cell is quite versatile and can be used to implement a large number of logic functions. The use and versatility of such a cell is disclosed in X. Chen and S.L. Hurst, "A Comparison of Universal Logic Module Realizations and Their Application I the Synthesis of Combinatorial and Sequential Logic Networks," IEEE Transactions on Computers, Vol. C-31, no. 2. pp. 140–147, Feb., 1982, which is expressly incorporated herein by reference. FIG. 2c is a table showing the connections of the various inputs and outputs necessary to achieve popular logic functions. The five terminals of the logic cell (S,A,B,Q,Q) are hardwired to 5 separate vertical wiring channels as shown in FIGS. 2a and 2b.

Also shown in FIGS. 2b is a testability circuit, designated generally as 35. In a preferred embodiment, this circuit comprises two N channel transistors 35a and 35b. The gate of transistor 35a is connected to CSEL. The gate of transistor 35b is connected to the Q output of the module. The drain of 35a is connected to the RSEN line and its source is connected to the drain of transistor 35b. The source of transistor 35b is grounded. When column select line (CSEL) 36 is activated by program, test, and I/O blocks 14, transistor 35a is biased to conduct. Both CSEL line 36 and RSEN line 37 are continuous lines; one CSEL line 36 will be provided for each column of functional circuit modules 20 and one RSEN line 37 will be provided for each row of functional circuit modules 20. Thus a moveable virtual probe, able to connect to the output of any selected logic module, is provided.

The embodiment depicted in FIG. 2b of an array module 12 according to the present invention consists therefore of a functional circuit module 20 with inputs S, A, B and outputs $\overline{Q}$ and Q, a testability circuit 35, vertical wiring channels, and horizontal wiring channels. The horizontal wiring channels 31 are wire segments joined by programmable elements, as will be described below. While the embodiments disclosed herein refer to channels as horizontal and vertical, those of ordinary skill in the art will readily recognize that any shape of path may be employed as a matter of design choice.

Figure 2D:
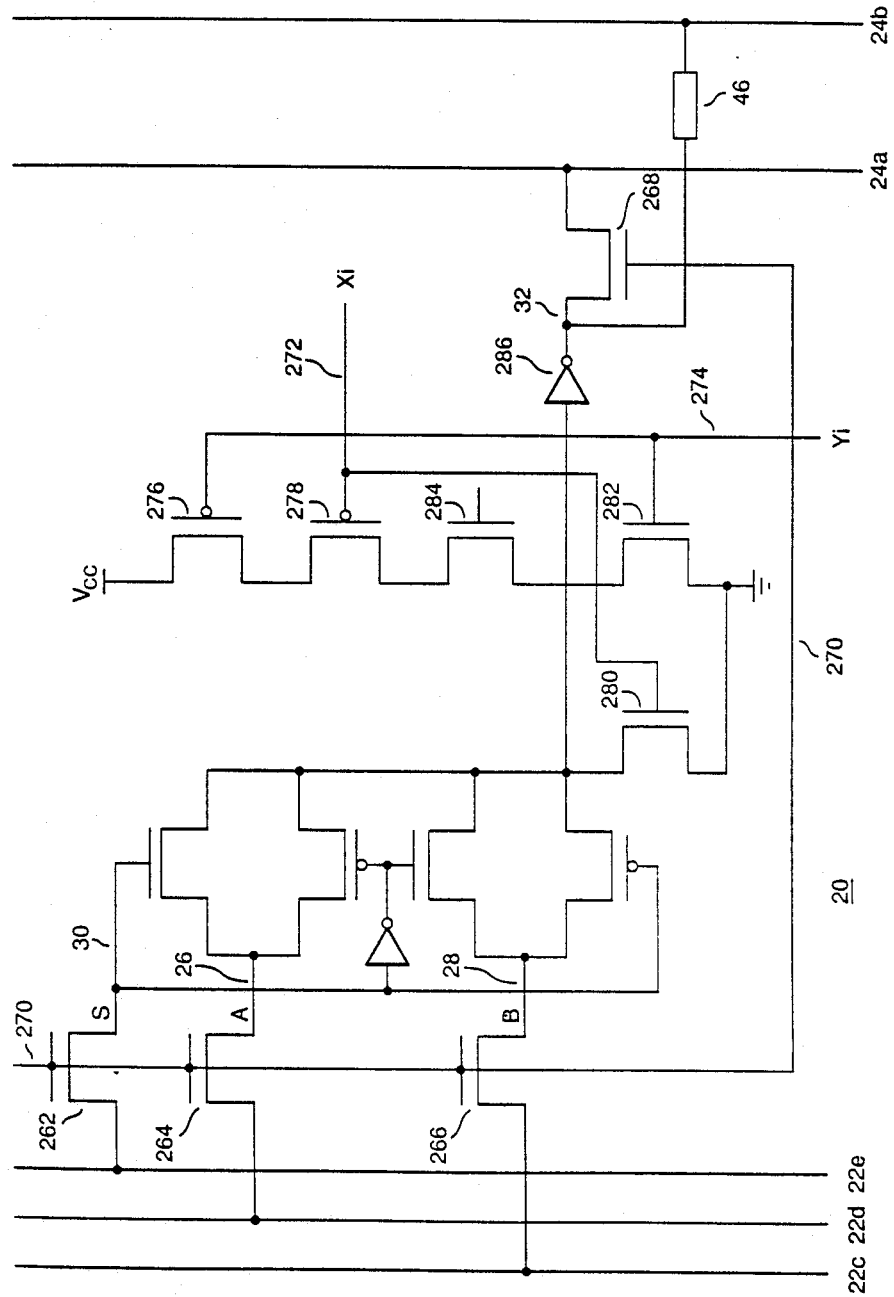
FIG. 2d is a logic diagram of a logic array module like that of FIG. 2b, further including isolation devices and other apparatus to enable programming of programmable interconnect elements associated with the module.

Referring now to FIG. 2d, an alternative and presently-preferred embodiment for connecting the functional module 20 to the wiring channels of the present invention is disclosed. As in the embodiment of FIGS. 2a and 2b, functional output module 20 has an A input 26, a B input 28, an S input 30, and a $\overline{Q}$ output 32. However, unlike the functional output module 20 embodiment of FIG. 2a, wherein the A input is directly connected to wiring segment 22d, the B input is connected directly to wiring segment 22e, the S input is connected directly to wiring 22c and the $\overline{Q}$ output is connected directly to wiring segment 24a, in the embodiment of FIG. 2d, these inputs and outputs are connected to their respective wiring segments through isolation devices.

S input 30 is connected to wiring segment 22e through isolation device 262, A input 26 is connected to wiring segment 22d through isolation device 264, B input 28 is connected to wiring segment 22c through isolation device 266, and $\overline{Q}$ output 32 is connected to wiring segment 24a through isolation device 268.

Isolation devices 262, 264, 266, and 268 have their gates commonly connected to an isolation control line 270. The application of zero volts to isolation control line 270 turns off isolation devices 262, 264, 266 and 268 and thus isolates all of the inputs and outputs of functional module 20 from the wiring segments.

Isolation devices 262, 264, 266, and 268 are used to isolate the functional module 20 from the remainder of the circuit only during programming. During normal operation these devices are enabled via isolation control line 270 from a suitable control signal generated by the program test I/O circuit 14 of FIG. 1a.

In addition, the embodiment of FIG. 2d has an electrically-programmable element 46 connecting $\overline{Q}$ output 32 of functional module 20 to a vertical wiring segment 24d. If element 46 is left unprogrammed, wiring segment 24d remains electrically unassociated with functional module 20. If an extra vertical wiring segment such as 24d is provided in an array according to the present invention, interconnections between functional output modules 20 may be made with fewer fuses 46 interposed in between the inputs and outputs, thus lowering the impedance of the connection and providing for faster operation. Segment 24d may be connected to any one of several modules by programming a selected fuse.

The modules 20 may be connected to wiring segments such as 24d by programming the programmable element 46. During the programming of the array, when isolation control line 270 is grounded, functional output module 20 is effectively isolated from wiring segments 22c, 22d, 22e, and 24a by isolation devices 262, 264, 266 and 268. By addressing a particular functional module 20 via its Xi address and Yi address lines, shown respectively as lines 272 and 274, through a set of conventional X and Y decoders known to those of ordinary skill in the art, the output 32 of that selected functional module 20 may be forced to ground. Output 32 of the selected functional module may also be forced to a voltage approximating Vcc. When a programming voltage Vpp is applied to wiring segment 24d, electrically programmable element 46 will be programmed if output 32 of the selected functional module is at ground, and will not be programmed if output 32 is at a voltage approximately equal to Vcc.

The forcing of $\overline{Q}$ output 32 to ground or Vcc is accomplished by circuitry including devices 276, 278, 280, 282, and 284. P-channel devices 276, 278 and 284 are connected in series between Vcc and the input of inverter 286. N-channel devices 280 and 282 are connected in parallel between the input of inverter 286 and ground. The gates of p-channel transistor 286 and n-channel transistor 282 are connected to the Yi input 274. The gates of p-channel transistor 278 and n-channel transistor 280 are connected to the Xi input 272. The gate of p-channel transistor 284 is connected to the isolation line 270.

If input lines Xi 272 and Yi 274 are both set to zero volts (ground), p-channel devices 276 and 278 are turned on and n-channel devices 280 and 282 are turned off. If isolation line 270 is at a logic low level (ground), p-channel device 284 will be turned on. When p-channel devices 276, 278 and 284 are all turned on, Vcc is connected to the input of inverter 286, thus forcing its output, the output 32 of the module, to the ground. If, however, both Xi 272, and Yi 274 are not set to zero volts, the input of invertor 286 is brought low, because either one of n-channel transistors 280 or 282 is on, thus forcing the input of inverter 286 to ground, and placing $\overline{Q}$ output 32 at a voltage approximating Vcc, between ground and Vpp. When Vpp is applied to wiring segment 24d there is not enough voltage across electrically-programmable element 46 to program it if output 32 is at Vcc; however, it will be programmed if output 32 is at ground.

Care must be taken in selecting an order for programming the desired electrically programmable elements 46 of FIG. 2d to guarantee that no others are accidentally programmed. A recommended order is to program the programmable elements 46 relating to the functional module 20 after all other desired elements in the array block 10 have been programmed. At this time, the elements at row i (an arbitrary row), of the array block 10 are programmed first, followed by the ones at rows i+1 and i−1 in any order, then the ones at rows i-2 and i+2 and so on. As those of ordinary skill in the art will realize, no more than one module output should be connected to a vertical wiring segment 24d via a fuse 46 to prevent contention.

Since the functional modules 20 are typically arranged in a matrix array in an embodiment of the present invention, in any given application it is a matter of chance whether inputs S, A, and B, 30, 26, and 28 respectively of FIG. 2a will receive connections from another functional module 20 above it or below it in the array. Since the objective of the designer is always to provide the shortest possible path in making connections, it is advantageous to provide for connections to the S, A, and B inputs from either side of the circuit module 12 (from FIG. 1) containing functional module 20.

In order to accomplish this objective, one of ordinary skill in the art, familiar with "standard cell" design methods would connect the S, the A, and the B inputs as well as output of functional module 20, to individual conductors in a layer overlying the functional module 20. While such a solution might be satisfactory on a small scale, in a medium to large size array, this solution becomes unworkable because of the cumulative stray capacitance inherent in the wiring segment used to connect that input or output. For example, if one wishes to make a connection to a circuit module from the circuit module below it in the array, that is easily accomplished by programming the electrically-programmable element connecting a portion of the wiring segment associated with that input on the side below the module. However, the stray capacitance which exists on the side of the wiring segment which remains unconnected will, in medium to large sized arrays, soon result in a cumulatively large and unacceptable stray capacitance which will degrade the speed performance of the array.

In addition, the inter-module spacing of the functional modules 20 in an array of the present invention is related to the horizontal wiring channels which run in the spaces between the modules. If short wiring segment giving access to the inputs and outputs of the module are run vertically so that they overlie horizontal wiring channels on each side of the module, such short wiring segments will interfere with the short wiring segments from adjacent modules which also have to extend over the same horizontal wiring channels for access. The staggering of these short wiring segments, while it may be possible, would use up more inter-module space and, in small pitches, could result in design rule problems.

Figures 2E, 2F:
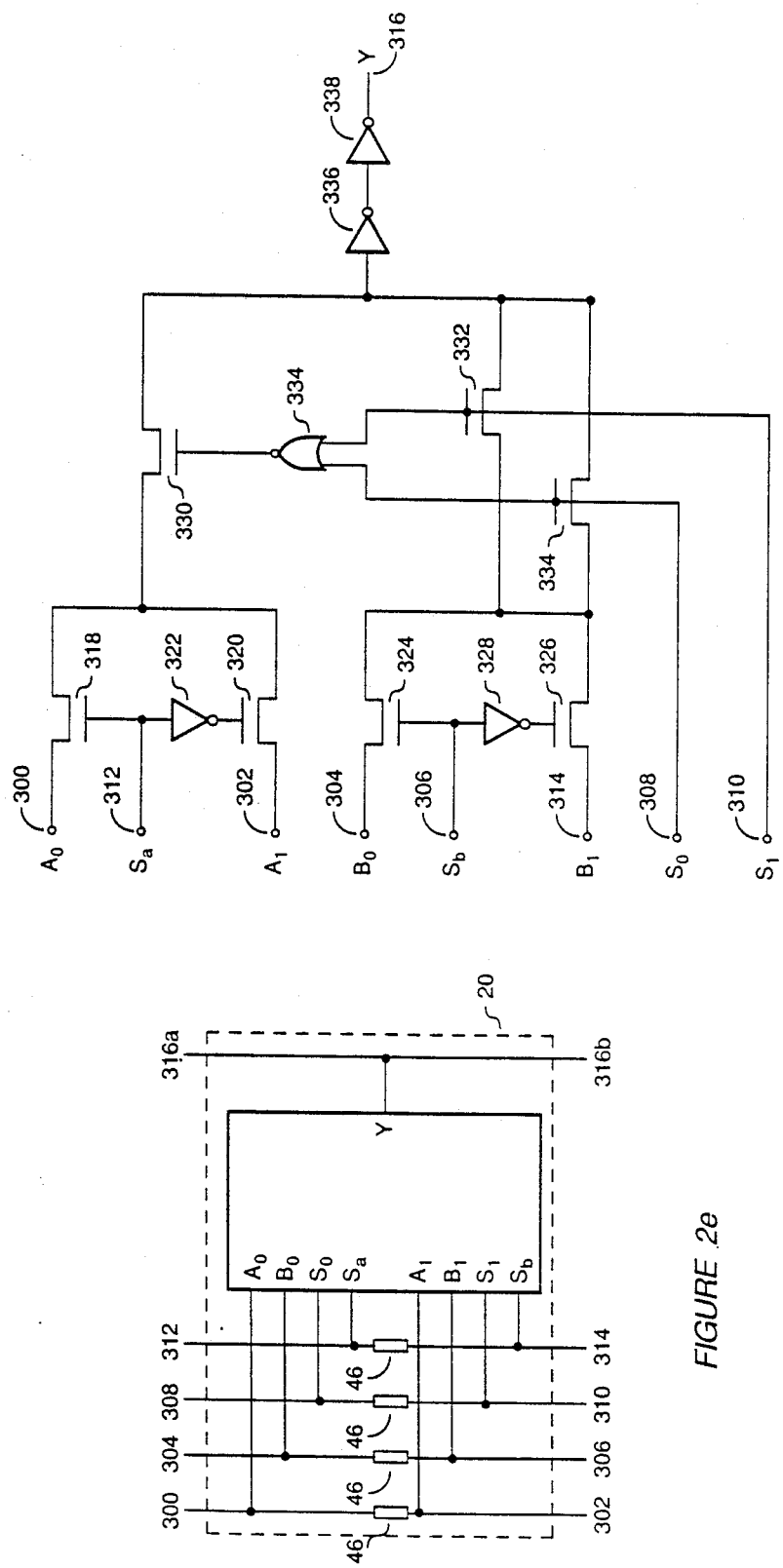
FIG. 2e is a block representation of a functional module according to a presently-preferred embodiment of the invention showing the physical placement of wiring segment connections to the inputs and outputs of the functional module.
FIG. 2f is a schematic diagram of a presently-preferred embodiment of a functional module of the present invention.

The solution to this problem in a preferred embodiment of the present invention is shown with respect to FIGS. 2e and 2f. Referring first to FIG. 2e, functional module 20 is shown as a block having inputs $a_0$, $a_1$, $b_0$, $b_1$, $s_0$, $s_1$, $s_a$, and $s_b$, connected to short wiring segments represented at reference numerals 300, 302, 304, 306, 308, 310, 312, and 314, respectively. The output, designated in FIG. 2e as Y, is shown connected at both sides of functional module 20 by a longer wiring segment 316a and 316b. The versatility of the physical layout of the module 20 of FIG. 2e is apparent. Both A and B inputs are available on either side of the module, as is an output multiplexer select input (Sa or Sb), and an output Y. This arrangement allows a designer maximum freedom in configuring particular circuits.

The function of these inputs shown in functional module 20 in FIG. 2e is most easily seen with reference to FIG. 2f. Referring now to FIG. 2f, it can be seen that the $a_0$ input 300 and the $a_1$ input 302 are fed to a first 2:1 multiplexer comprising n-channel transistors 318 and 320, and inverter 322 The control line for the multiplexer is at the $s_a$ input 312. Similarly, the $b_0$ input 304 and $b_1$ input 314 are inputs to a 2:1 multiplexer comprising n-channel transistors 324 and 326, and inverter 328. The output of the a multiplexer is connected to n-channel transistor 330 The output of the b-multiplexer is connected to n-channel transistors 332 and 334. Transistors 330, 332 and 334 are used as a third or output multiplexer. Those of ordinary skill in the art will recognize that n-channel transistors 332 and 334 are connected with respect to the $s_0$ and $s_1$ inputs 308 and 310 are connected so as to pass the output of the b-multiplexer through to inverter 336 if either $s_0$ input 308 or $s_1$ input 310 is high. If neither of those inputs is high, the output of the a-multiplexer will be passed to inverter 336 through n-channel transistor 330. N-channel transistor 330 is driven by NOR gate 336. Those of ordinary skill in the art will recognize that a standard OR gate arrangement drives the output multiplexer selection. Although an OR gate is presently preferred, any gate, preferably symmetrical (AND, OR, NAND, NOR, EXOR,) will function. Inverters 338 and 40 form a buffer amplifier to drive Y output 316.

The functional module circuit in FIG. 2f is a highly versatile circuit This circuit is capable of implementing a large variety of logic functions. These functions, along with the conditions on the inputs necessary to implement them, are shown in FIG. 2g.

Those of ordinary skill in the art will realize that the isolation techniques for the functional module depicted in FIG. 2d, allowing the programming of the elements associated with the module output, can equally be applied to the module circuit depicted in FIG. 2f.

FIG. 3 depicts a preferred embodiment of the connection 38 which connects together the segmented wiring channels of the present invention. A series-pass transistor 40 has its source 42 and drain 44 connected in parallel with a programmable element 46. A series-pass transistor may be connected across each programmable element 46 in a circuit, or only across selected ones, depending on the circuit designer's needs for a given application.

In a preferred embodiment, programmable element 46 consists of an element like that described in a co-pending application entitled "Programmable Logic Interconnect Circuit Element," Ser. No. 861,519, filed May 9, 1986, and assigned to the same assignee as the present invention. This application is expressly incorporated herein by reference. Simply stated, this "interconnect circuit element" consists of two conductors separated by a dielectric which may be electrically programmed by applying a programming voltage across the two conductors, the voltage having a magnitude sufficient to rupture the dielectric and create a low impedance interconnect. Other electrically-programmable anti-fuse elements will function in the environment of the present invention.

Those of ordinary skill in the art will recognize that in certain applications a diode interconnect element, like that described in co-pending application, Ser. No. 864,038, filed May 16, 1986, entitled "Programmable Low Impedance Interconnect Diode Element" may be used. This co-pending application is hereby expressly incorporated by reference The series-pass transistor 40 in parallel with the interconnect circuit element 46 is activated by applying an appropriate voltage to its gate in order to bypass programmable element 46. When series-pass transistor 40 is not activated, a potential may be created across programmable element 46 in order to "program" that element by creating a durable low-impedance electrical contact between the two conductors, as described above. It will be understood by those of ordinary skill in the art that other programmable interconnect elements, such as fusible links, could be used to configure the architecture of the present invention, although the implementation mechanism would differ according to the nature of the interconnect element.

Figure 4:
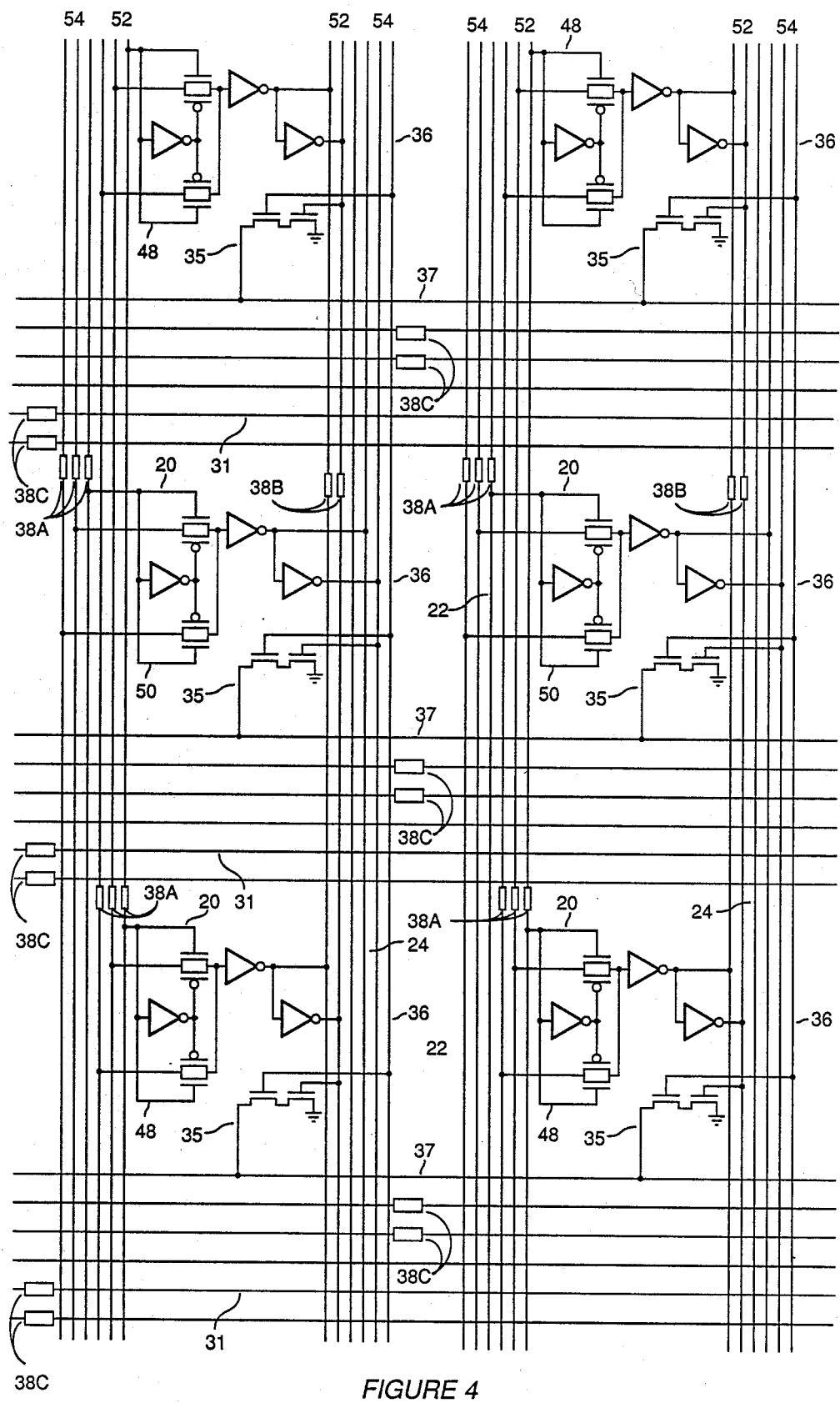
FIG. 4 shows an expanded view of a section of an array according to a presently-preferred embodiment of the invention consisting of two columns and three rows of modules.

FIG. 4 shows an expanded view of a section of the user-programmable circuit array with logic cells or individual circuit modules 12 in 2 columns and 3 rows. Each module is identical to the one shown in FIG. 2b. The diagram further illustrates how vertical wiring channels 22 and 24 and horizontal wiring channels 31 are connected to various logic cells and their allocation between adjacent cells.

The vertical channels connected to the logic cell terminals are shared between the logic cells of alternate rows. This is done by segmenting the channels so that each cell has unique vertical channel segments. Cells in odd rows (cells 48) use the same vertical channel space (channels 52). Cells in even rows (cells 50) use the same vertical channel space (channels 54), but not the same vertical channel space as the odd rows (channels 52). Channel segmentation is accomplished by series-pass transistors or pass series transistors with programmable elements connected in parallel connections 38A, 38B, and 38C generally described above under reference numeral 38 A similar channel segmentation technique is used for the horizontal wiring channels. In FIG. 4, connections 38A join vertical channel segments on the input side of the logic modules, connections 38B join vertical channel segments on the output side of the logic modules, and connections 38C join horizontal channel segments The segmentation techniques are illustrated in more detail in FIGS. 5 and 6.

Figure 5:
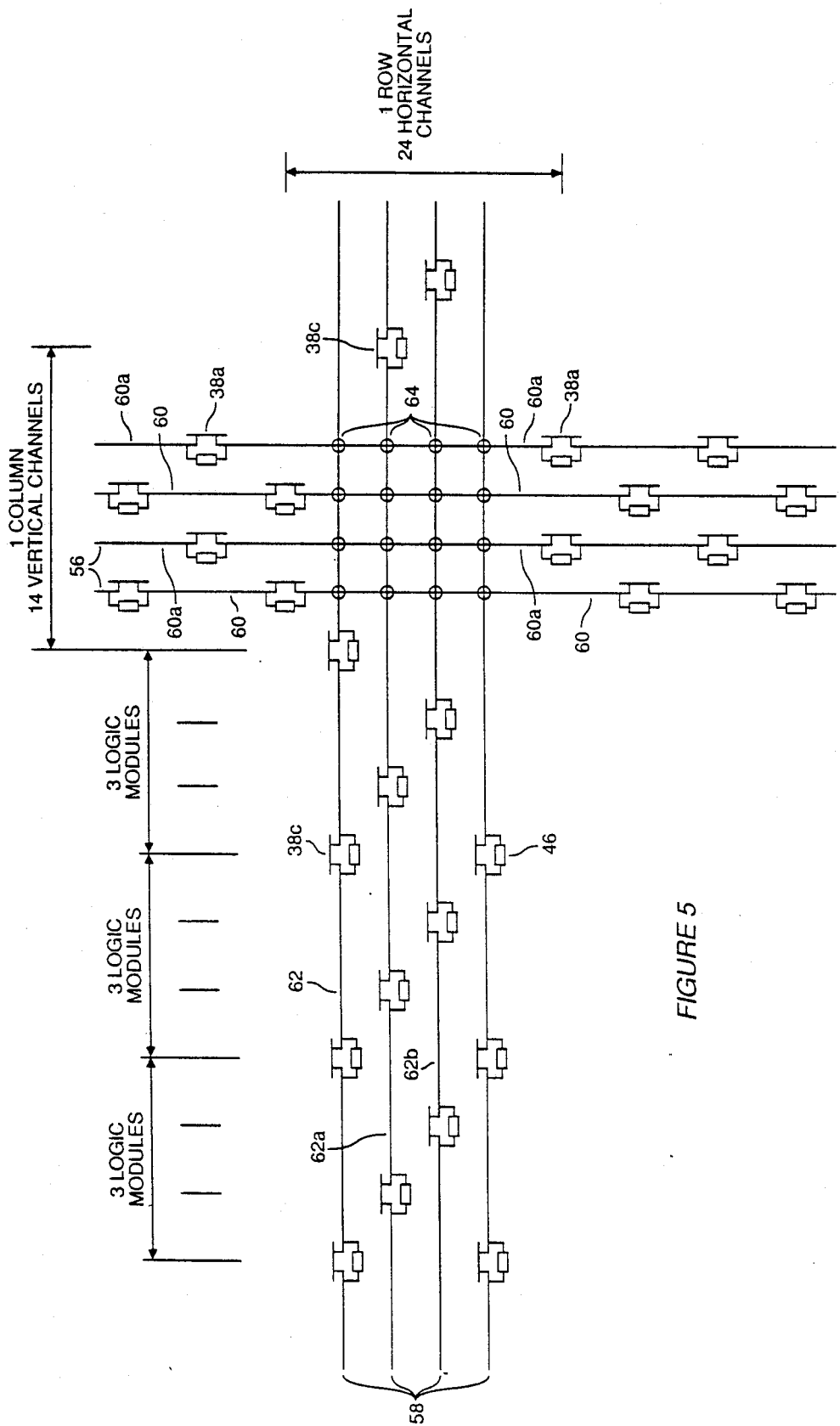
FIG. 5 is a schematic diagram of a portion of the vertical and horizontal channel wiring used in a preferred embodiment of the present invention.

FIG. 5 illustrates the vertical and horizontal channel wiring segmentation of a preferred embodiment of the present invention. As previously mentioned earlier, wiring channels are segmented and offset for a more efficient utilization of the available wiring space and reduction of overhead circuits for the selection and programming functions (the circuits that activate series-pass transistors 40 in the connections 38). The example in FIG. 5 uses 14 vertical channels per column of modules and 24 horizontal channels per row of modules for a 23 column, 14 row matrix of logic modules; the vertical channels and horizontal channels shown are only illustrative; only vertical channels, horizontal channels, and control lines are shown in FIG. 6.

Figure 6:
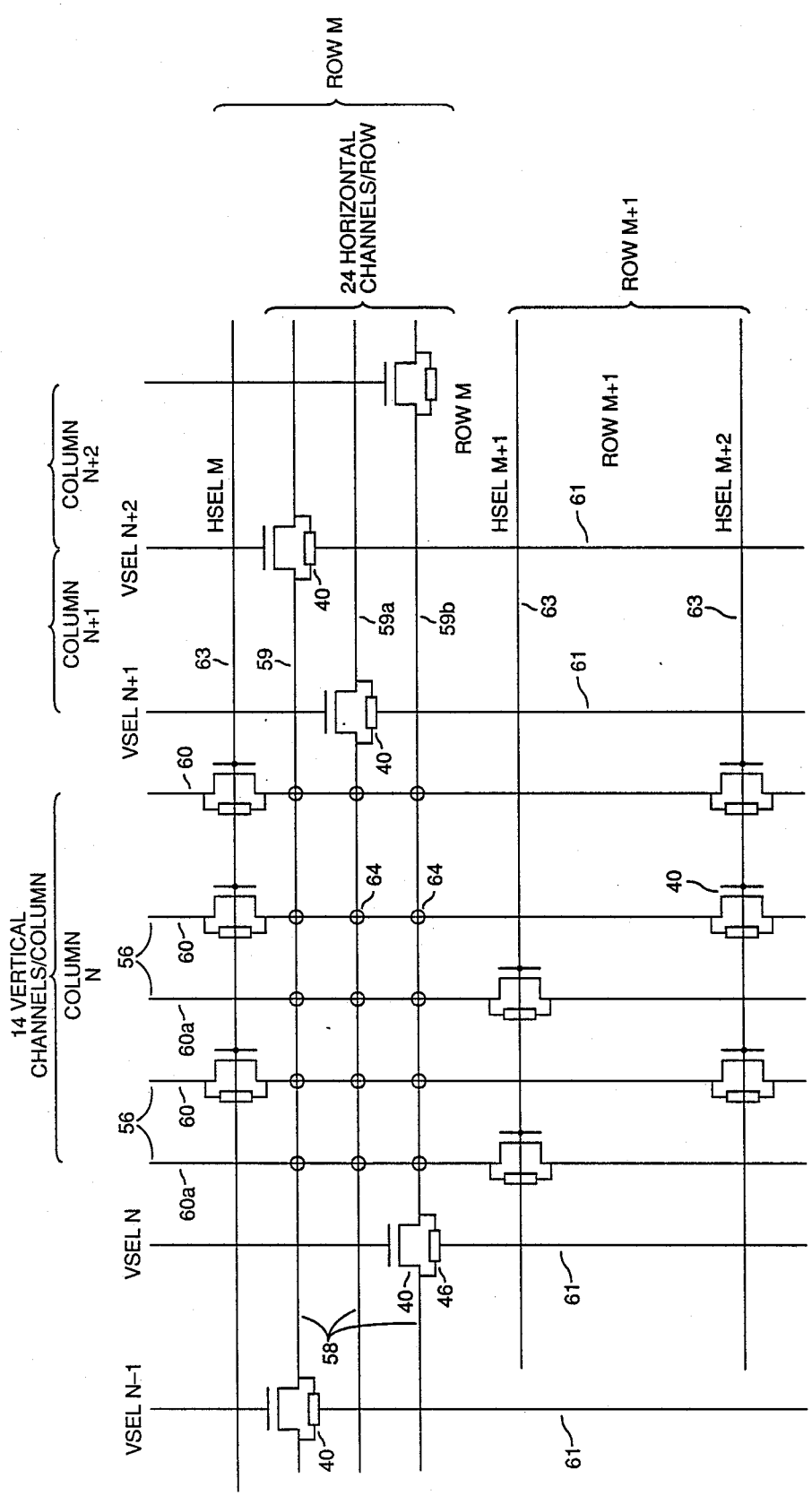
FIG. 6 is a further expansion of the horizontal and vertical channel wiring scheme to illustrate a preferred segmentation mechanism.

Vertical channels generally referred to in FIGS. 5 and 6 as 56 are segmented into a series of segments 60 or 60a with each segment extending over the length of two rows and each segment separated from adjacent segments by series-pass transistors 40 with a programmable element 46 connected in parallel.

Each vertical channel 56 is also offset by one module height from its adjacent channel. For example, as shown in FIG. 6, if a vertical channel segment 60 starts at module row M, then the adjacent channel segment 60a would start at module row M+1 and the following segment would start at module row M. The vertical offset technique is referred to as to a 2-way staggered wiring scheme. This segment offset technique provides a significant reduction in the number of channels required for routing.

The series-pass transistors 40 that connect vertical wiring segments 60, 60a or horizontal wiring segments 59, 59a, 59b are controlled by vertical select lines (VSEL) 61 and horizontal select lines (HSEL) 63, respectively. The VSEL and HSEL control lines can bias the series-pass transistors to which they are connected in order to cause such transistors to conduct. The control lines do not need to be continuous throughout the array as indicated in FIG. 6.

In a preferred embodiment, the series-pass transistors 40 are used as feed-through selection transistors during programming of the programmable elements 46 as illustrated in FIG. 6. The vertical segment length must be at least one module length. A length of 2 is preferred but may be varied to implement different wiring alternatives. A segment length which is too long may be inefficient in the use of wiring space while segment lengths which are too short may degrade performance and be less efficient in silicon area utilization.

A similar segmentation and offset technique is applied to horizontal wiring channels 58. In the example shown in FIG. 5, the horizontal segment length is 3, i.e., each horizontal segment 62, 62a or 62b extends over 3 columns of modules. The horizontal wiring scheme also uses a segment offset technique with an offset value in a preferred embodiment of 3 module lengths.

Figure 7A:
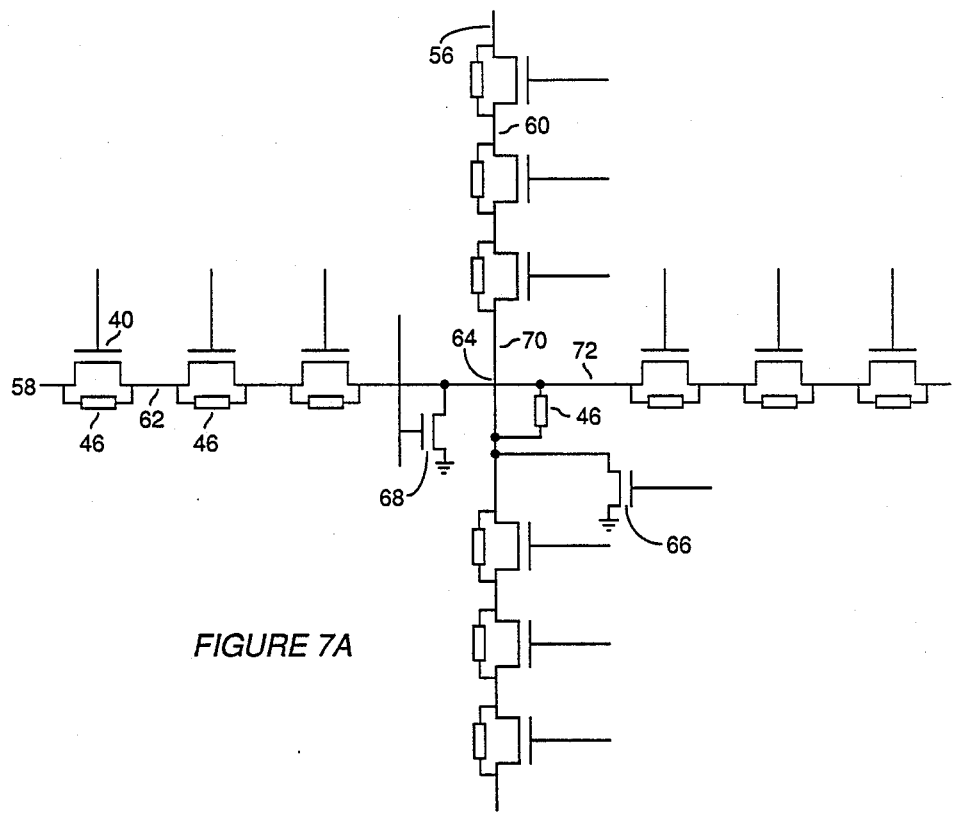

A normally open, unprogrammed programmable-element fuse 46 is placed at the intersection 64 of each vertical and horizontal channel, as may best be seen in FIG. 7a. When the programmable element 46 is programmed, an electrical connection is made between the channels at the intersection 64. In this architecture, any vertical channel may thus be connected to any horizontal channel by means of a programmable element.

FIGS. 7a to 7d and 7f to 7i illustrate the programming techniques used to connect various channel segment configurations including vertical to horizontal connection, vertical segment to vertical segment and horizontal segment to horizontal segment connection. FIG. 7a shows one vertical channel 56 and one horizontal channel 58 intersecting as shown. The relative locations of the vertical and horizontal channels in the array are not important and the same programming technique is used regardless of position in the array.

Two additional transistors are shown in FIG. 7a; a vertical select transistor 66 and a horizontal select transistor 68. The vertical select transistor 66 pulls the middle vertical segment 70 of a vertical channel 56 to ground while the horizontal select transistor 68 is used to pull middle horizontal segment 72 of a horizontal channel 58 to ground. Vertical or horizontal select transistors 66 or 68 may also charge up the middle segment to the appropriate voltage needed for programming. Vertical and horizontal select transistors 66 and 68 are useful to lower the series resistance of a wiring channel during programming by reducing the number of transistors between the programming voltage and ground, as is best seen in FIGS. 7c and 7d. They need not be connected to middle wiring segments but middle wiring segments are preferred.

Figure 7B:
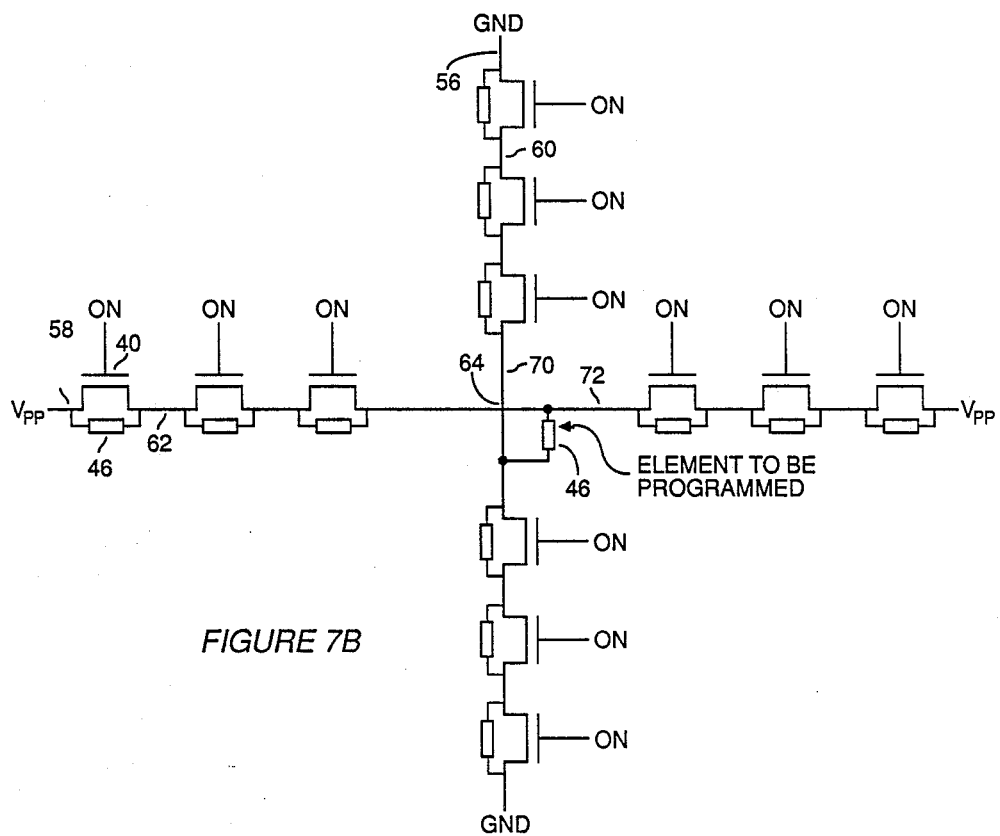

FIG. 7b illustrates how the vertical and horizontal channels may be programmed to make a connection between them. The programming voltage Vpp is applied to one or both ends of the horizontal channel 58 while ground potential GND is applied to one or both ends of the vertical channel 56. The appropriate series-pass transistors 40 are turned on, i.e., biased to conduct. The programmable element 46 at intersection 64 would then be programmed and a connection made between the two intersecting segments shown in FIG. 7b. The voltages Vpp and GND may be applied to both sides of the horizontal and vertical channel to provide lower resistance in the programming path and hence more efficient programming and lower final resistance of the programming element 46 at intersection 64. All other horizontal and vertical segments not selected to program the programmable elements in FIG. 7b are biased to an intermediate voltage VI such that the voltage difference between VI and GND, and VI and Vpp is insufficient to program a programmable element. This same technique is used in all the programming examples shown in FIG. 7b-7d.

FIG. 7c illustrates how a vertical segment would be programmed to connect to its adjacent segment. The program voltage Vpp is applied to the programmable element 76 to be programmed while the middle segment 70 is pulled to ground by the vertical select transistor 66. All series transistors between Vpp node and the middle segment are turned on except for the particular transistor 74 whose terminals are to be connected by the programmable element 76. This forces the programming voltage across the programmable element 76 and programs it.

FIG. 7d shows a similar scheme used for horizontal segment connections to adjacent horizontal segments. In this case, the horizontal select transistor 68 is turned on, pulling the middle horizontal segment to ground while Vpp is applied to one end of the horizontal channel. All series transistors are on except the series transistor 78 whose terminals are to be connected by programming programmable element 80.

Those of ordinary skill in the art will recognize that the programming process is not reversible, and that, depending on how a particular array according to the present invention is implemented, thought should be given to the order in which the particular desired elements are programmed.

By way of illustration, attention is drawn to FIG. 7e, which shows wiring channels 82, 84, 86, and 88 having fuses 90, 92, 94, and 96 at their intersections. Pass transistor 98 is also shown. Assume that it is desired to program fuses 90, 92, and 94 but not 96.

Those of ordinary skill in the art will readily see that if fuses 90 and 92 are programmed before fuse 94, it cannot be guaranteed that fuse 94 can be programmed. This is because series-pass transistor 98 must be turned on to allow fuse 94 to be programmed. If, however, fuses 90 and 94 are programmed prior to fuse 92, all three fuses may be programmed successfully, leaving fuse 96 unprogrammed, as desired FIG. 7f illustrates an alternative structure and method for supplying the necessary voltages to program the programmable elements connecting wiring segments of the present invention.

Figure 7F:
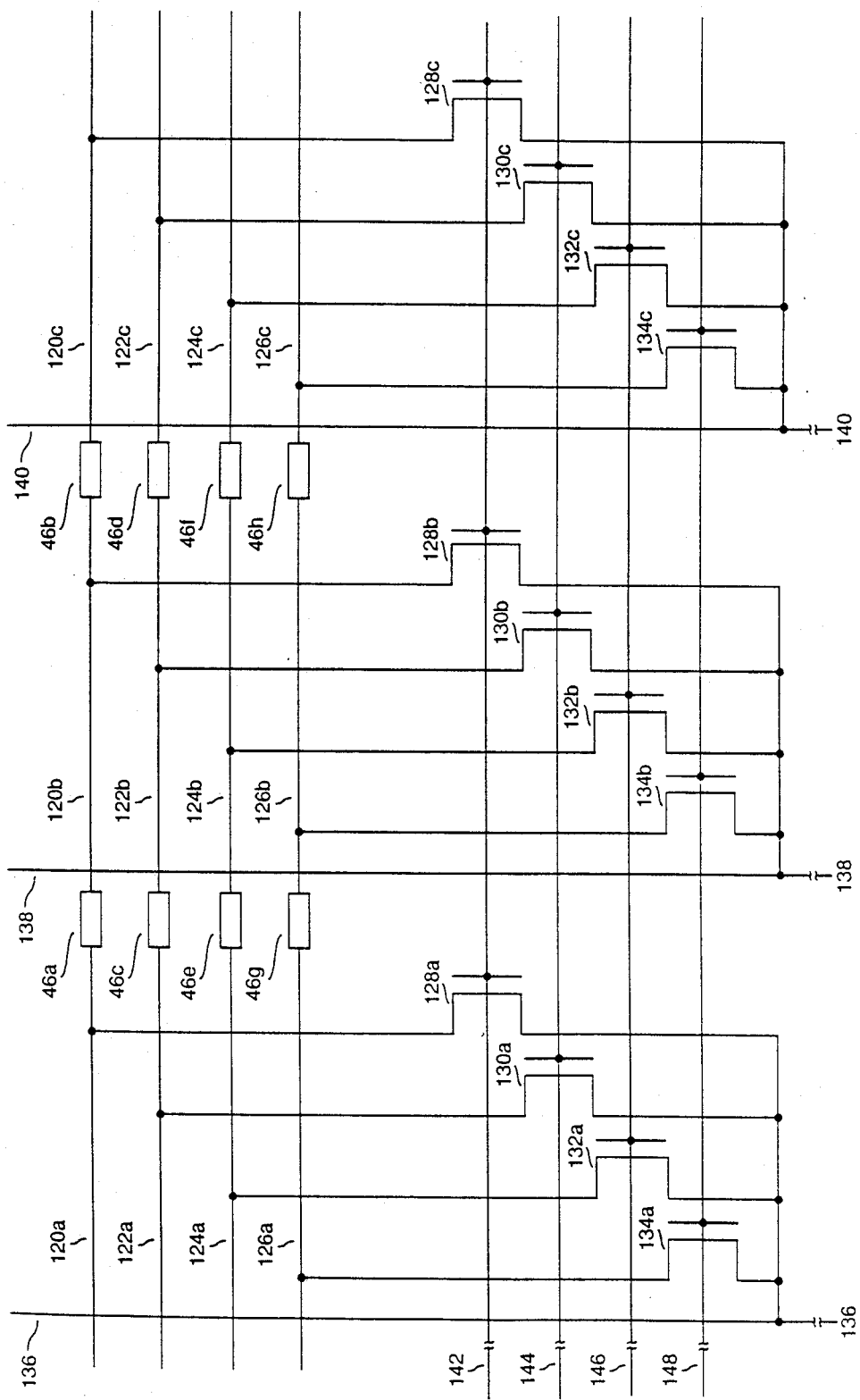

As disclosed in FIG. 7f, wiring segments 120, 122, 124 and 126 would be located in the area of array block 10 of FIG. 1a. They are shown segmented as 120a-c, 122a-c, 124a-c, and 126a-c. Each of the wiring segments is separated by an electrically-programmable element 46a-h such that wiring segment 120a is separated from 120b by an electrically programmable element 46a and wiring segment 120b is separated from wiring segment 120c by another electrically programmable element 46b, etc.. Those of ordinary skill in the art will realize that the arrangement shown in the embodiment of FIG. 7f is merely illustrative and that, while four wiring segments 120, 122, 124, and 126 are shown as an illustrative wiring channel, an arbitrary number of wiring segments can be provided. This selection depends only on the application and is merely a designer's choice.

A set of transistor devices 128, 130, 132, and 134 are shown associated with each of wiring segments 120, 122, 124, and 126, respectively. Thus, wiring segment 120a is connected to a first main terminal of transistor 128a, wiring segment 122a is connected to a first main terminal of transistor 130a, wiring segment 124a is connected to a first main terminal of transistor 132a, and wiring segment 126a is connected to a first main terminal of transistor 134a. Wiring segments 120b, 122b, 124b, and 126b are similarly connected to transistors 128b, 130b, 132b, and 134b, respectively, as are wiring segments 120c, 122c, 124c, and 126c to transistors 128c, 130c, 132c, and 134c, respectively Those of ordinary skill in the art will realize that, although FIG. 7f shows the use of n-channel transistors, other devices, such as p-channel transistors or bipolar transistors could be used. If bipolar transistors are used, however, programming methods are obviously limited since a bipolar transistor is a unidirectional device Each group of transistors 128a, 130a, 132a, and 134a, 128b, 130b, 132b, and 134b, 128c, 130c, 132c, and 134c has its other main terminal commonly connected to a programming line 136, 138, or 140, respectively. Those of ordinary skill in the art will understand that programming lines 136, 138, and 140, may run the entire length or width of an array block 10. Likewise, gate control lines 142, 144, 146, and 148, may run the entire width or length of the array block 10.

The gates of transistors of 128a-c are commonly connected to gate control line 142. The gates of transistors 130a-c are commonly connected to gate control line 144. The gates of transistors 132a-c are commonly connected to gate control line 146. The gates of transistors 134a-c are commonly connected to gate control line 148. Gate control lines 142, 144, 146 and 148 may run across the entire length of the array block 10 of FIG. 1a if desired.

Programming lines 136, 138 and 140 are used to supply the voltage levels necessary to program electrically-programmable elements 46. Each of these lines may be connected to either ground potential, VI (Vpp/2), or Vpp. These voltages may be supplied by channel control logic units 23 (as shown and described with respect to FIG. 1b.). Gate control lines 142, 144, 146, and 148 are driven by the program test I/O circuitry 14 (FIGS. 1a and b.).

The programming circuitry of FIG. 7f functions as follows. Assume that it is desired to join wiring segments 122a and 122b by programming the programmable element 46 interposed between them. Using the circuitry disclosed in FIG. 7f, a voltage of zero volts or ground is applied to programming line 136, a voltage of Vpp, is applied to programming line 138, and VI (equal to VPP/2) is applied to programming line 140.

The zero voltage appearing on programming line 136 is applied to segment 122a via transistor 130a, by applying a voltage to gate line 144. Transistor 130b will apply Vpp potential to wiring segment 122b via programming line 138 if its gate is raised to a voltage of Vpp plus a voltage threshold. On the other hand, transistor 130c will apply VI to wiring segment 122c via transistor of its gate line 130c. Since gate line 144 commonly controls transistors 130a-c, it must be raised to Vpp plus a voltage threshold if Vpp is to appear on wiring segment 122b. Gate control lines 142, 146, and 148 will remain grounded, thus preventing programming voltages from being impressed upon any of segments 120a-c, 124a-c, and 124a-c.

Those of ordinary skill in the art will recognize that the circuitry show in FIG. 7f may be a small part of such circuitry disposed over the entire area of an array block 10 of FIG. 1a.

One advantage of the embodiment of FIG. 7f is that the series-pass transistors 40 (only one is shown in FIG. 7f across element 46g to avoid over-complicating the figure) which may be placed in parallel with electrically-programmable elements 46a-h to implement the testability functions disclosed herein can be smaller devices since they are not needed for programming and thus need not have the current-carrying capacity needed to program the programmable elements. Instead, transistors 128a-c, 130a-c, 132a-c, and 134a-c are the devices which must be capable of carrying programming current and which, hence, must be of a sufficient size to handle such currents.

Other circuitry, similar to the embodiment of FIG. 7f, are possible for use in programming the user-programmable array of the present invention. For instance, the embodiment shown in FIG. 7g uses only a single gate control line to control programming rather than the four gate control lines utilized in FIG. 7f.

Figure 7G:
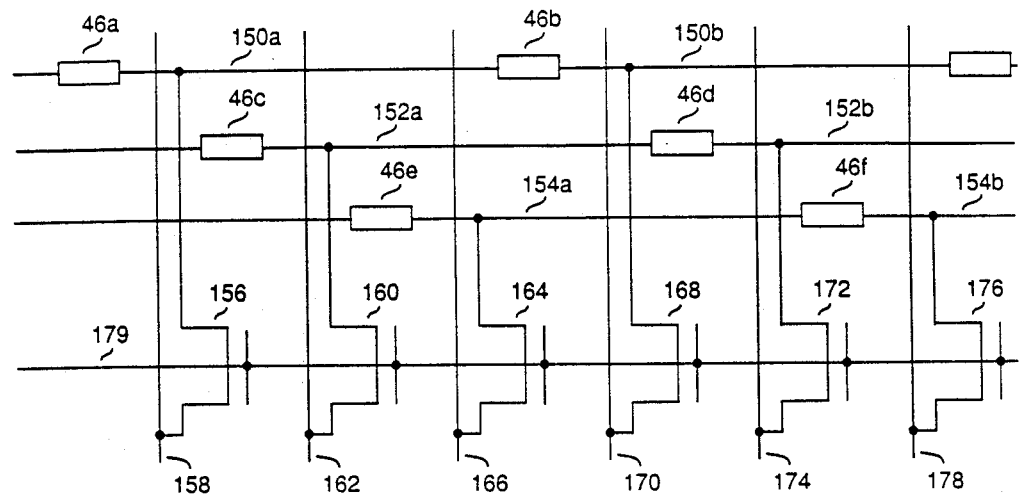

In the embodiment of FIG. 7g, wiring segments 150a and 150b are shown in combination with electrically-programmable elements 46a and 46b; wiring segments 152a and 152b are shown in combination with electrically-programmable elements 46c and 46d and wiring segment 154a and 154b are shown in combination with electrically-programmable elements 46e and 46f. One illustration series-pass transistor is shown connected across element 46a, although one of ordinary skill in the art will recognize that all elements 46 could have an associated series-pass transistor 40 if full testability is desired, as will be more fully explained herein.

Programming transistor 156 has one of its main terminals connected to wiring segment 150a. Its other main terminal is connected to programming line 158. Programming transistor 160 has one of its main terminals connected to wiring segment 152a and the other of its main terminals connected to programming line 162. Programming transistor 164 has one of its main terminals connected to wiring segment 154b and the other one of its main terminals connected to programming line 166. Programming transistor 168 has one of its main terminals connected to wiring segment 150b and the other one of main terminals connected to programming line 170. Programming transistor 172 has one of its main terminals connected to wiring segment 152b and the other one of its main terminals connected to programming line 174. Programming transistor 176 has one of its main terminals connected to wiring segment 154b and the other one of its main terminals connected to programming line 178. The gates of programming transistors 156, 160, 164, 168, 172 and 176 are commonly connected to gate control line 179. Thus, only one gate control line is needed to program any of these segments to which these transistors are connected. Those of ordinary skill in the art will recognize that programming lines 158, 162, 166, 170, 174 and 178, as well as gate control 179, may run the entire length or width of the array block 10 of FIG. 1a of which the circuit of FIG. 7g represents a small portion.

The operation of the circuit of FIG. 7g is as follows. Assume it is desired to program electrically-programmable element 46b. Channel control logic units 23 (from FIG. 1b) are used to place the necessary voltages on programming lines 158, 162, 166, 170, 174 and 178. In this case, programming line 158 or programming line 170 will have Vpp applied to it. The other one of those control lines will have zero volts applied to it. All of the other programming lines 162, 166, 174, and 178 will have VI applied to them. Thus, when gate control line 179 is enabled by placing upon it a voltage equal to approximately Vpp plus one voltage threshold, a voltage Vpp will appear across electrically-programmable element 46b, thus programming it.

Figure 7H:
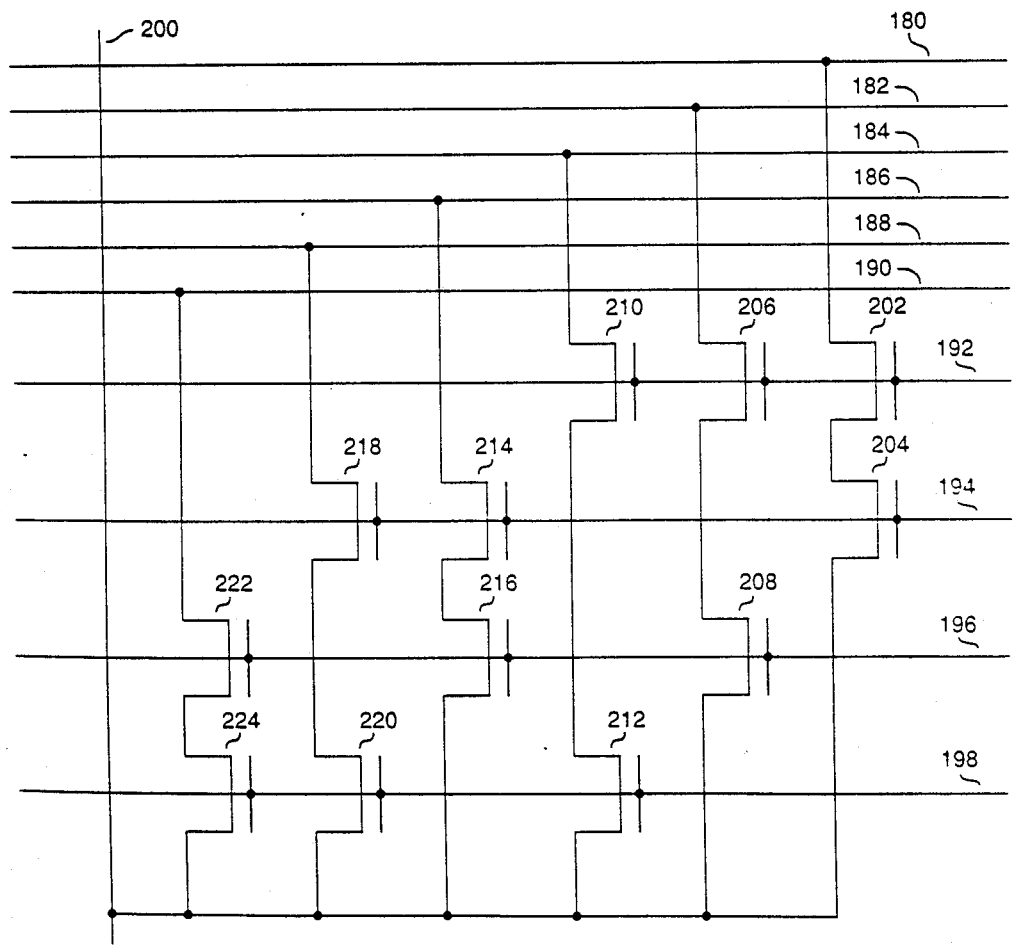

Another structure for programming the wiring segments of the present invention is disclosed with respect to FIG. 7h. In FIG. 7h, wiring segments 180, 182, 184, 186, 188, and 190, are shown each having an electrically-programmable element 46 at each end. Four gate control lines, 192, 194, 196 and 198, are used with this embodiment.

A single programming line 200 is utilized in the embodiment of FIG. 7h. Programming transistors 202 and 204 are shown connected in series between wiring segment 180 and programming line 200. Their gates are connected to gate control lines 192 and 194, respectively.

Programming transistors 206 and 208 are shown connected in series between wiring segment 182 and programming line 200. Their gates are connected to gate control lines 192 and 196, respectively.

Programming transistors 210 and 212 are shown connected in series between wiring segment 184 and programming line 200. Their gates are connected to gate control lines 192 and 198, respectively.

Programming transistors 214 and 216 are shown connected in series between wiring segment 186 and programming line 200. Their gates are connected to gate control lines 194 and 196, respectively.

Programming transistors 218 and 220 are shown connected in series between wiring segment 188 and programming line 200. Their gates are shown connected to gate control line 194 and 198, respectively.

Programming transistors 222 and 224 are shown connected in series between wiring segment 190 and programming line 200. Their gates are connected to gate control lines 196 and 198, respectively.

As shown in the embodiment of FIG. 7h, it is possible to reduce the number of control lines needed per row of channels at the expense of the use of additional transistors. If two transistors per segment and N control lines per row of channel are used, it is possible to control segments in up to N (N−1)/2 wiring channels. This is accomplished by connecting each pair of programming transistors in a column to a pair of control lines in a different way. To control a particular segment, the corresponding pair of control lines should be turned on while the others are left off. For example, in order to place the voltage appearing on programming line 200 onto wiring segment 184, gate control lines 192 and 196 would be turned on while gate control lines 194 and 198 remain off. Since only transistors 210 and 212 are connected to activated gate control lines, only wiring segment 184 will be connected to voltage appearing on programming line 200.

Figure 7I:
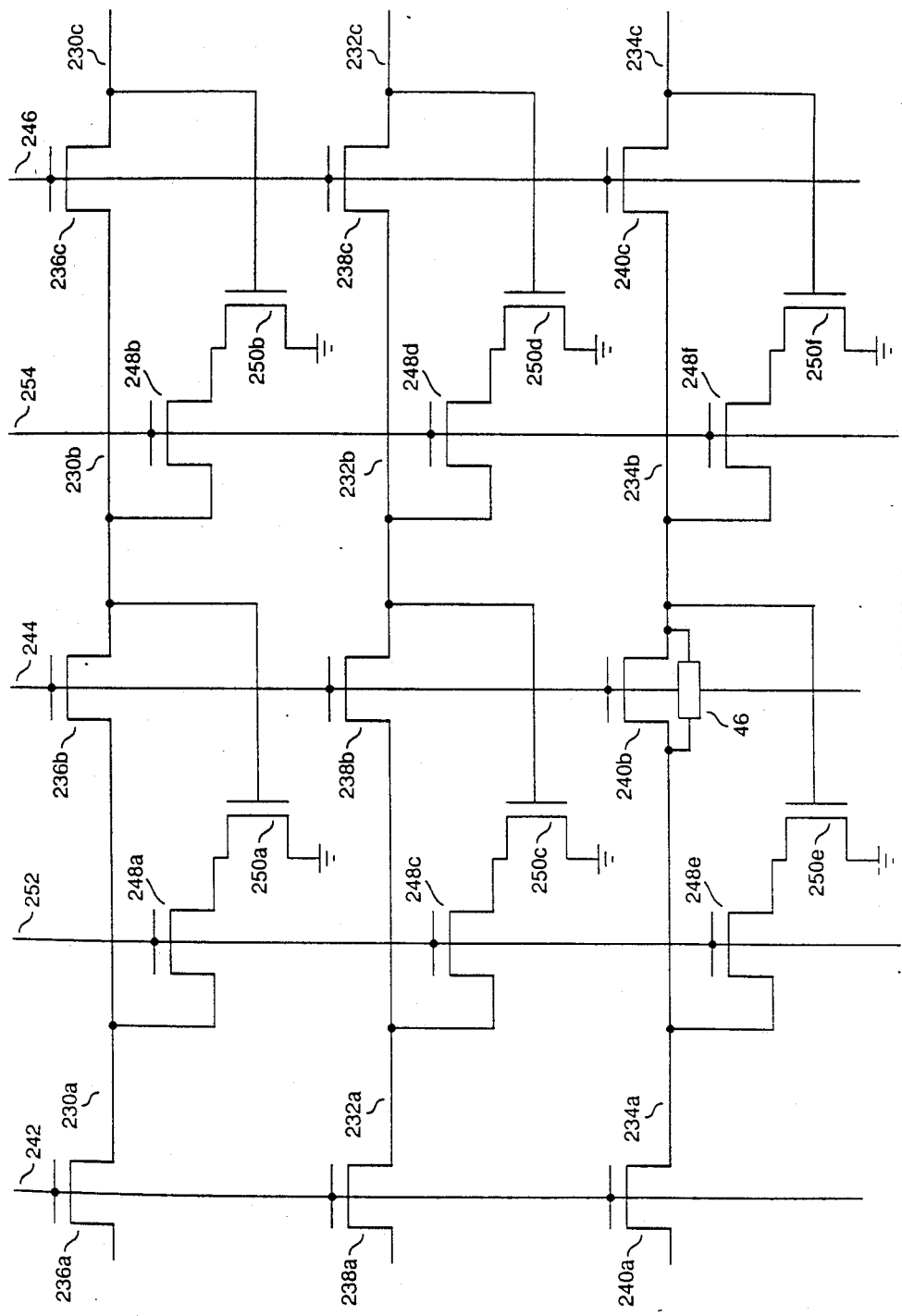

Another embodiment for supplying programming voltages to the wiring segments of the present invention is disclosed with respect to FIG. 7i. In the embodiment of FIG. 7i, wiring segments 230a and 230b, 232a and 232b, 234a and 234b are shown connected by series-pass transistors 236b, 238b and 240b, respectively. Series-pass transistors 236a, 236c, 238a, 238c, 240a and 240c are shown for the purpose of illustrating how other segments are joined to wiring segments 230a, 230b, 232a, 232b, 234a, and 234b.

An electrically-programmable element 46 is shown connected across series-pass transistor 240b in FIG. 7i. Those of ordinary skill in the art will realize that, although similar elements 46 have been omitted with respect to the other series-pass transistors in FIG. 7i, nevertheless, such elements do exist across such series-pass transistors. They are omitted mainly for the sake of clarity, to avoid unnecessarily complicating the drawing.

In the embodiment of FIG. 7i, the programming voltages are brought from the periphery of array block 10 to the electrically-programmable element which is to be programmed by activating the series-pass transistors interposed in the pathway between the periphery of block 10 and the segment which is desired to be programed.

Gate control line 242 is commonly connected to the gate of series-pass transistors 236a, 238a, and 240a. Gate control line 244 is commonly connected to the gates of series-pass transistors 236b, 238b, and 240b. Gate control line 246 is commonly connected to the gates of series-pass transistors 236c, 238c, and 240c.

In the embodiment of FIG. 7i, two additional control transistors are added to control each segment. No additional control wires need be added to control these transistors; the transistors are controlled either through the existing segments in the array, or by a single additional gate control line which is added to each column.

As can be seen from FIG. 7i, control transistors 248a and 250a are connected in series between wiring segment 230a and ground. Similarly, control transistors 248b and 250b are connected in series between wiring segment 230b and ground; control transistors 248c and 250c are connected in series between wiring segment 232a and ground; control transistors 248d and 250d are connected in series between wiring segments 232b and ground; control transistors 248e and 250e are connected between wiring segment 234a and ground; and control transistors 248f and 250f are connected in series between wiring segment 234b and ground. The gates of control transistor 248a, 248c, and 248e, are connected in common to gate control line 252.

The gates of control transistors 248b, 248d, and 248f are connected in common to gate control line 254. Gate of control transistor 250a is connected to wiring segment 230b. The gate of control transistor 250b is connected to wiring segment 230b. The gate of control transistor 250a is connected to wiring segment 230b. The gate of control transistor 250b and connected to wiring segment 230c, the gate of control transistor 250c is connected to wiring segment 232b, the gate of control transistor 250d is connected to wiring segment 232c, the gate of control transistor 250e is connected to wiring segment 234b, and the gate of control transistor 250f is connected to wiring segment 234c.

In order to program electrically-programmable element 46, shown shunting horizontal series-pass transistor 240b, the programming voltage Vpp must be placed across that device, while its associated series-pass transistor 240b is off. Therefore, gate control line 244 is held at ground. Gate control line 246, and all gate control lines to the right of gate control line 246 (not shown) all the way to the periphery of array block 10 of FIG. 1 are held at Vpp plus a threshold voltage. Vpp is applied to the end of the last wiring segment. In the example at FIG. 7i, assume that wiring segment 234c is at the periphery of the array. Vpp is thus applied to wiring segment 234c. Since series-pass transistor 240c is turned on, Vpp appears on wiring segment 234b.

In order to ground wiring segment 234a, Vpp is applied to additional control line 252, thus turning on control transistor 248e. Control transistor 250e is also turned on by the presence of Vpp appearing on control line 234b, thus placing the voltage Vpp across electrically-programmable element 46 to program it. Since additional gate control line 254 is placed at ground, control transistor 248f will be turned off, even though additional control transistor 250f is turned on. In this manner, wiring channel 234b is not pulled to ground.

Those of ordinary skill in the art will realize that in the embodiments of FIGS. 7f–h the series-pass transistors do not have to be sized with programming current considerations in mind, but that the embodiments of FIGS. 7a–d, will as the embodiment of FIG. 7i, must be of a size sufficient to withstand programming current.

The technique of FIG. 7i, as well as the techniques of the preceding figures can be used to program cross electrically-programmable elements, i.e., electrically-programmable elements such as elements 46 shown in FIG. 7a and 7b between horizontal and vertical wiring segments. The two series-connected additional control transistors in the vertical segments would be P-channel devices, thus allowing any selected vertical wiring segment to be brought to a voltage of Vpp while the selected horizontal wiring segment is brought to ground using the circuit of FIG. 7i, or a similar circuit.

Figure 8A:
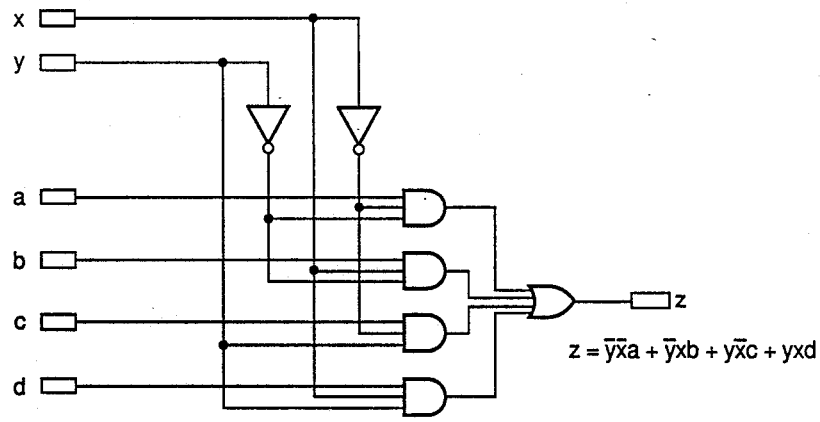
FIGS. 8a, 8b, 9a, and 9b are examples of use of the logic cell, which illustrate how typical circuit connections would be made.
Figure 8B:
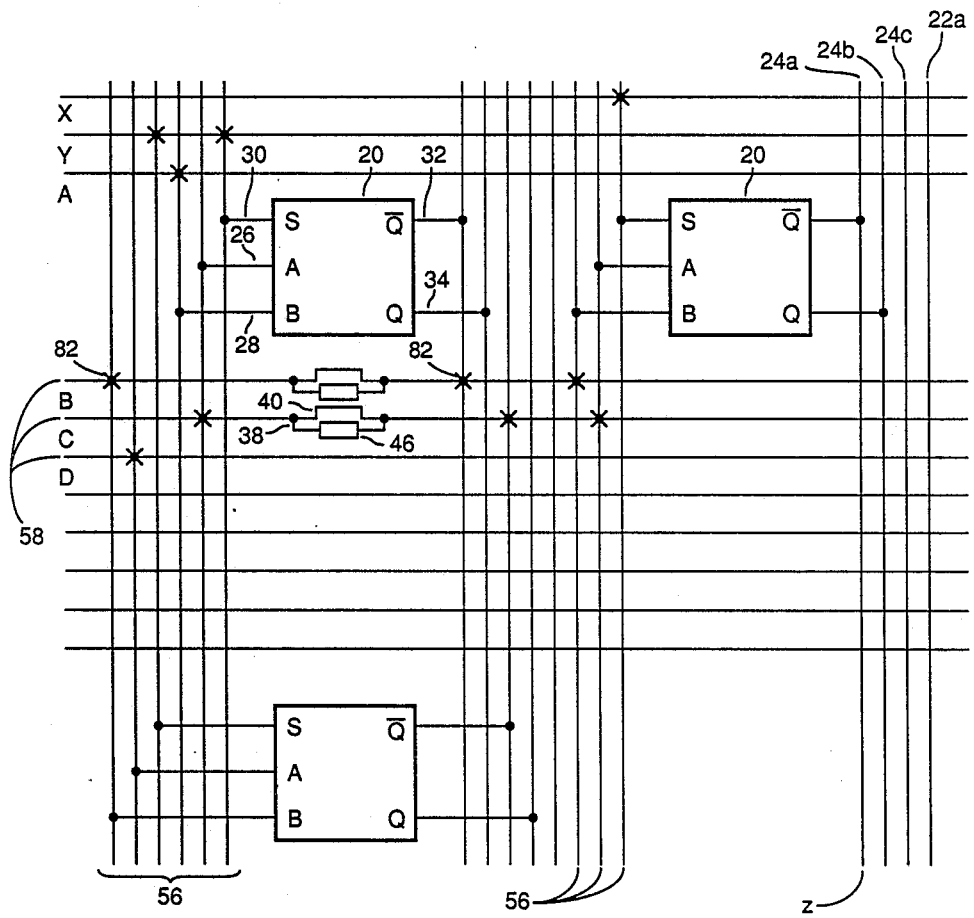

FIGS. 8a and 8b show a typical application of the logic array. (Testability circuit 35 is not shown.) FIG. 8a shows the logical function implementation of a one of four selector:

$$Z = \bar{y}\bar{x}a + \bar{y}xb + y\bar{x}c + yxd$$

Where x, y, a, b, c, d, and z represent voltage inputs and outputs.

FIG. 8b (compare to FIG. 2a) shows how that logical function is mapped into the array using three logic cells 20 and associated vertical and horizontal channels 56 and 58. The X designation 82 at various vertical and horizontal channel intersections shows the location of a programmed element, i.e., the two intersecting wires have been connected by a programmable element using the techniques described in FIG. 7a.

Figure 9A:
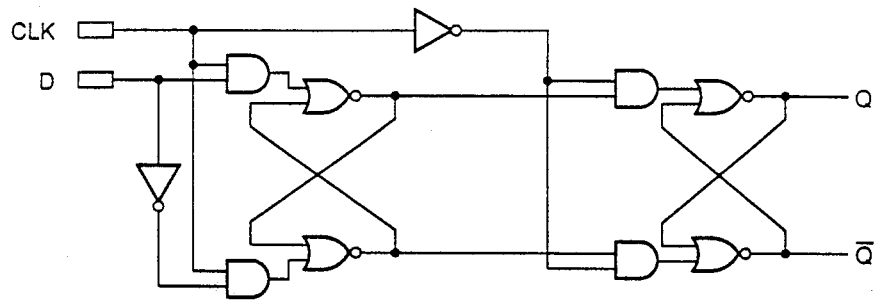
Figure 9B:
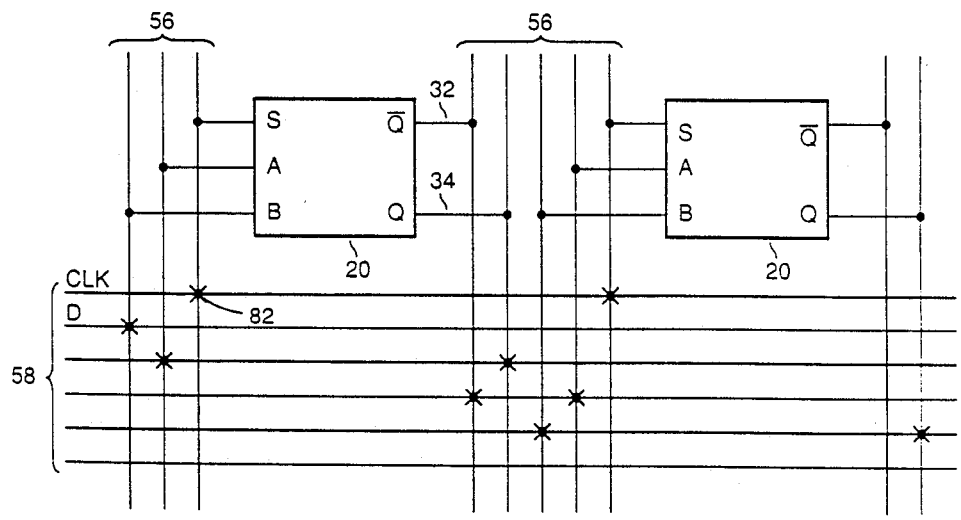

FIGS. 9a and 9b are another example of application of the logic array. FIG. 9a is the logic diagram of a master-slave flip flop, while FIG. 9b is the same master-slave flip flop implemented using two logic cells 20 of the logic array.

One embodiment of the program and test logic 14 uses a combination of shift registers and decoders to do the selection and control functions needed during programming or testing as disclosed with respect to FIG. 1b. To program a particular wiring connection in the interconnect grid, the appropriate data pattern is first shifted into shift registers in the program, test, and I/O blocks 14. Using this pattern and some local decode logic, the two horizontal and vertical wires to be connected in the grid are uniquely selected A biasing voltage is applied to the appropriate VSEL lines 61 and HSEL lines 63 to turn ON the appropriate series-pass transistors 46. The appropriate programming voltage is then applied and the connection made, using the techniques described in connection with FIGS. 7a–7d. All the selection and decoding is therefore done at the periphery of the array 10.

Figure 10A:
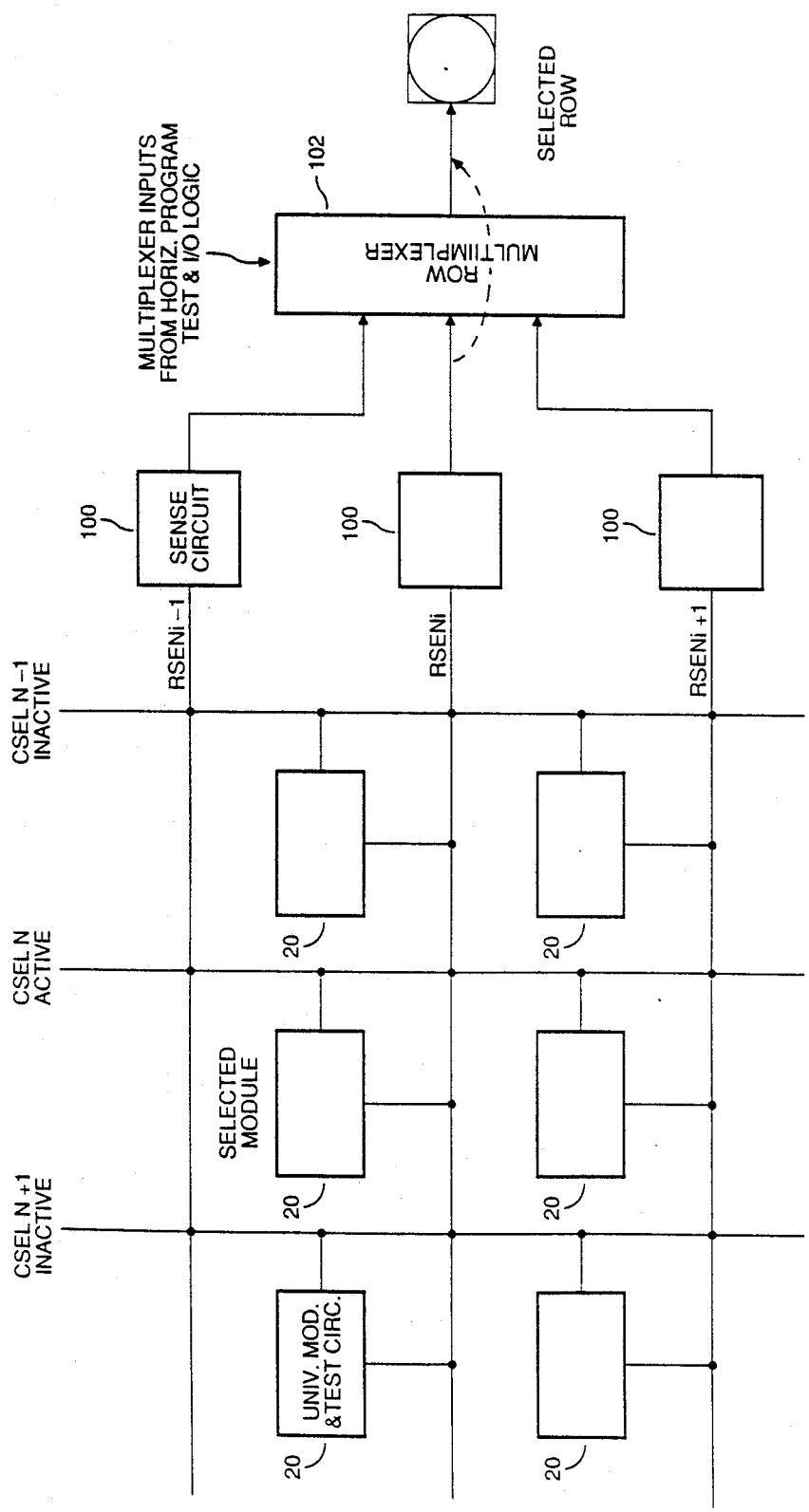
FIG. 10a illustrates the operation of the moveable virtual probe mode of diagnosis.

The same shift registers and decoders which are used for programming are also used for circuit diagnosis. The test point selection data pattern is shifted into the shift registers 19 of the program, test and I/O circuit 14 in FIG. 1b and the output of a selected module is routed to the selected I/O pad 16 as shown in FIG. 10a.

Test point selection of internal array module outputs is performed by shifting a unique selection pattern into the program and test shift registers 19. This provides column and row information for selecting the modules to be tested. To test the module outputs shown in FIG. 2b, the corresponding column select (CSEL) line 36 is activated by the program and test logic, thus gating a logic level representing the value of the logic output of the module through transistors 35a and 35b onto the row sense (RSEN) line 37. The row select data, like the column select information, is obtained from a bit field in the shift registers 19 in the program, test and I/O circuitry 14. A sense circuit 100 detects the module output signal and feeds row multiplexer 102, which using the row select data, routes the signal to a designated I/O pad 16 for external observability of that module's output. This testing method allows the selection of any module output as a test point for external user monitoring and provides a real time moveable virtual probe to monitor internal chip node behavior. This probe method requires little additional circuit overhead, since programming and test circuitry are shared. This method may be expanded to provide multiple simultaneous probe test points.

Figure 10B:
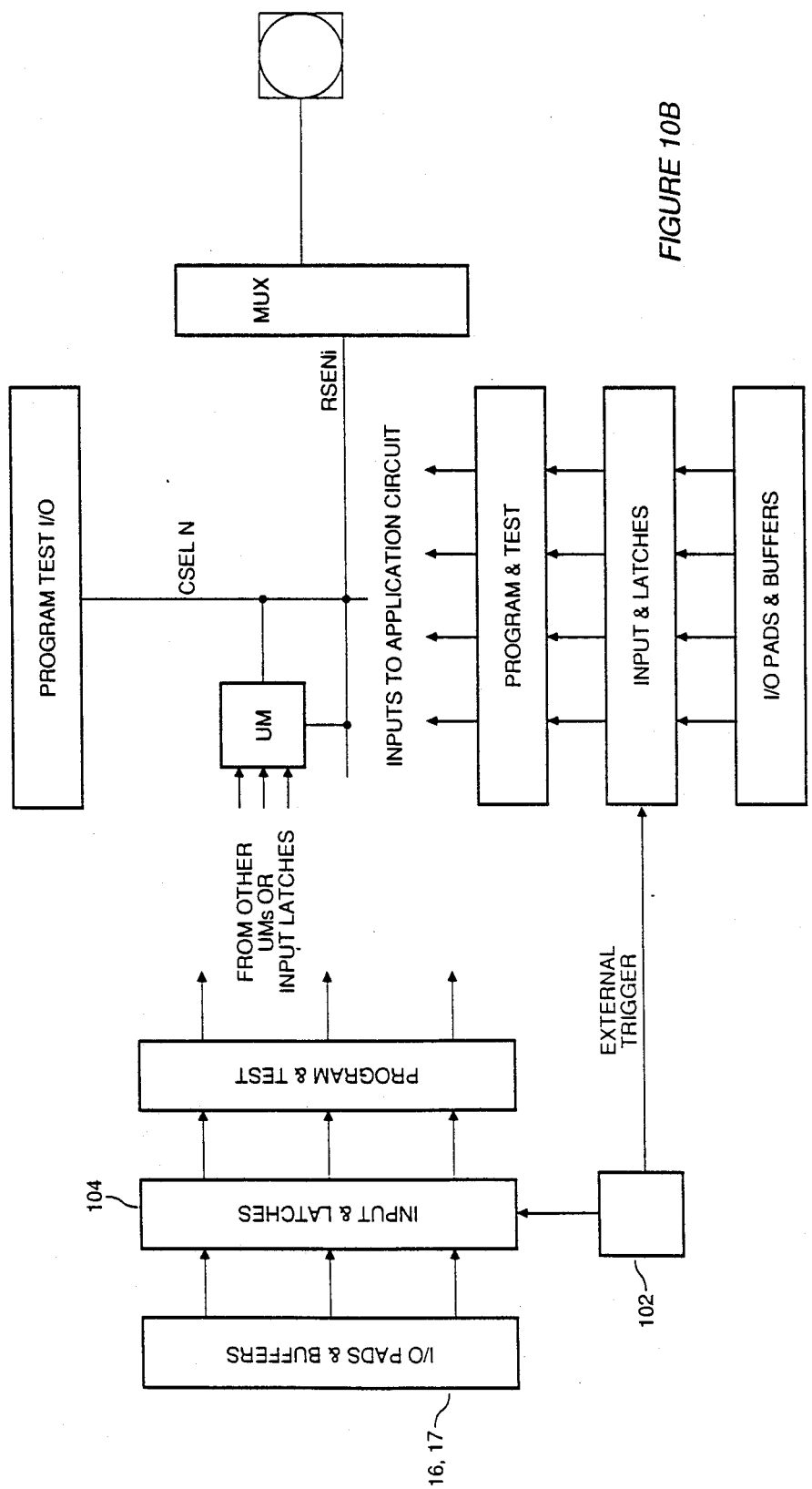
FIG. 10b illustrates the operation of the capture mode of diagnosis.

Another diagnostic technique called the capture mode is also possible. FIG. 10b illustrates the use of the capture mode in logic function testing. In this mode, an externally supplied trigger signal placed on a designated I/O pad 102 is used to latch all input signals to the I/O pads 16 and I/O buffers 17 into input latches 104. The inputs then propagate through the configured logic and reach a frozen state since all input stimuli are captured and frozen by the input latches. The program, test and I/O logic is then used to move the probe around the circuit and select any test point for observance, as disclosed in the real time moveable probe method. Namely, a unique column n is selected by the CSEL and a row is selected by the row multiplexor and routed to a designated I/O pad. This capture mode is similar to the commonly used logic analyzer function for debugging and testing of the internal nodes of the array.

The moveable probe mode and the capture mode of circuit diagnosis described above can be used to diagnose and test the logic function after the programmable elements have been programmed. They can also be used to test the logic modules at the factory before the programmable elements are programmed to verify the integrity cf these logic modules. In this case, the inputs to the logic modules are driven by the required test input patterns that are applied to selected I/O pads and connected to the logic module through the appropriate series-pass transistors. The proper series transistors are selected by the data pattern shifted in the shift registers in the program and test and I/O circuits 14 in FIG. 1a.

Thus, preferred embodiments of the invention have been illustrated and described with reference to the accompanying drawings. Those of skill in the art will understand that these preferred embodiments are given by way of example only. Various changes and modifications may be made without departing from the scope and spirit of the invention.

What is claimed is:

1. A universal logic module including:
    a first multiplexer having a first input, a second input, a first select input, and a first multiplexer output,
    a second multiplexer having a first input, a second input, a second select input, and a second multiplexer output,
    a third multiplexer having a first input connected to said first multiplexer output, a second input connected to said second multiplexer output, a third select input and a fourth select input, and a third multiplexer output,
    first selection means, in said first multiplexer, responsive to said first select input, for passing said first or said second input of said first multiplexer to said first multiplexer output
    second selection means, in said second multiplexer, responsive to said second select input, for passing said first or said second input of said second multiplexer to said second multiplexer output,
    third selection means, in said third multiplexer, responsive to said third and fourth select inputs, for passing said first multiplexer output or said second multiplexer output to said third multiplexer output.

2. The universal logic module of claim 1, wherein said third selection means causes said first multiplexer output to be connected to said third multiplexer output only if neither of said third and fourth select inputs is true, and otherwise causes said second multiplexer output to be connected to said third multiplexer output.

3. The universal logic module of claim 1 wherein said third selection means causes said first multiplexer output to be connected to said third multiplexer output only if both of said third and fourth select inputs are true and otherwise causes said second multiplexer output to be connected to said third multiplexer output.

4. The universal logic module of claim 1 wherein:
    said first multiplexer includes a first transistor connected between its first input and said first multiplexer output, a second transistor connected between its second input and said first multiplexer output, said first and second transistors having control elements, the control element of said first transistor connected to said first select input and the control element of said second transistor connected to the output of an inverter whose input is connected to said first select input, said second multiplexer includes a third transistor connected between its first input and said second multiplexer output, a fourth transistor connected between its second input and said second multiplexer output, said third and fourth transistors having control elements, the control element of said third transistor connected to said second select input and the control element of said fourth transistor connected to the output of an inverter whose input is connected to said second select input, and said third multiplexer includes a nor gate having first and second inputs connected to said third and fourth select inputs, respectively, a fifth transistor connected between its first input and said third multiplexer output, a sixth transistor connected between its second input and said third multiplexer output, and a seventh transistor connected between its second input and said third multiplexer output, said fifth, sixth, and seventh transistors having control elements, the control element of said fifth transistor connected to the output of said nor gate, the control element of said sixth transistor connected to said third select input, and the control element of said seventh transistor connected to said fourth select input.

5. The universal logic module of claim 4, layed out within a generally rectangular border, and wherein: wiring segments connected to said first input and said first select input, said first input of said second multiplexer, said third select input and said third multiplexer output emerge from said rectangular area on a first side, and, said second input of said first multiplexer, said second input and said second select input and said fourth select input and said third multiplexer output emerge on a second side of said rectangular area opposite from said first side.

* * * * *

UNITED STATES PATENT AND TRADEMARK OFFICE
CERTIFICATE OF CORRECTION

Page 1 of 11

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

Column 3, line 60, after "paths" insert --,--.
Column 7, line 16, replace "Q" with --$\bar{Q}$--.
Column 7, line 18, replace "FIGS." with --FIG.--.
Column 7, line 56, replace "22e" with --22c--.
Column 7, line 57, replace "22c" with --22e--.
Column 8, line 9, replace "I" with --In--.
Column 8, line 50, replace "286" with --276--.
Column 10, line 2, replace "S$_1$" with --s$_1$--.
Column 10, line 22, replace "a multiplexer" with --a-multiplexer--.
Column 10, line 30, replace "336" with --338--.
Column 10, line 32, replace "336" with --338--.
Column 10, line 39, replace "40" with --340--.
Column 11, line 49, after "38" insert--,--.
Column 13, line 25, replace "programming" with --programmable--.
Column 15, line 67, replace "154b" with --154a--.
Column 18, line 7, replace "and" with --is--.
Column 19, line 20, replace "46" with --40--.

Signed and Sealed this

Second Day of April, 1996

*Attest:*

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 4,910,417

DATED : March 20, 1990

INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 1B should appear as follows:

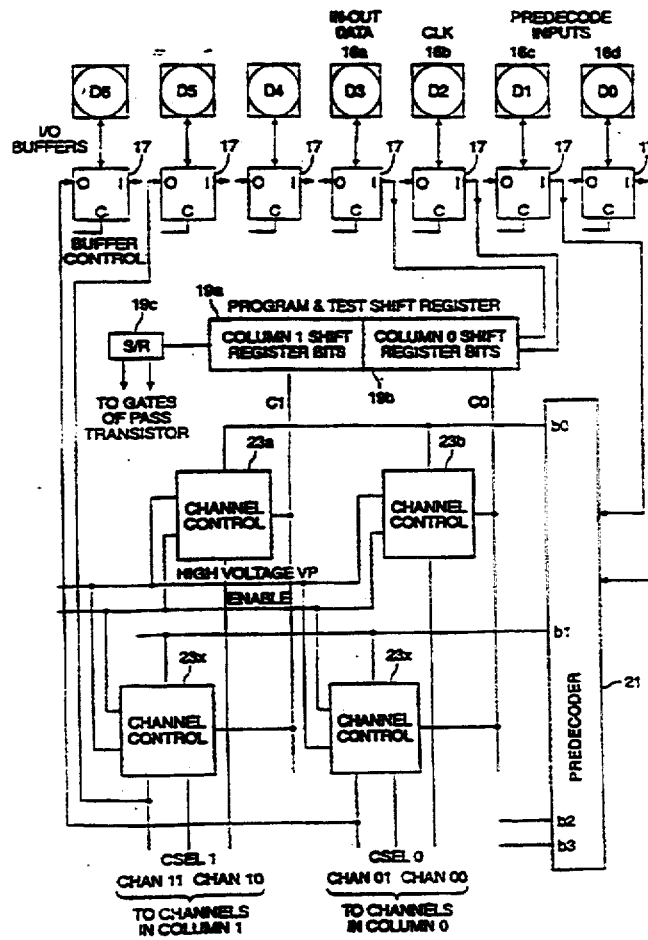

FIGURE 1B

UNITED STATES PATENT AND TRADEMARK OFFICE
CERTIFICATE OF CORRECTION

PATENT NO. : 4,910,417
DATED : March 20, 1990
INVENTOR(S) : Abbas El Gamal; Khaled A. El-Ayat; Jonathan W. Greene; Ta-Pen R. Guo It is certified that error appears in the above-indentified patent and that said Letters Patent is hereby corrected as shown below:

In the drawings, Fig. 2A should appear as follows:

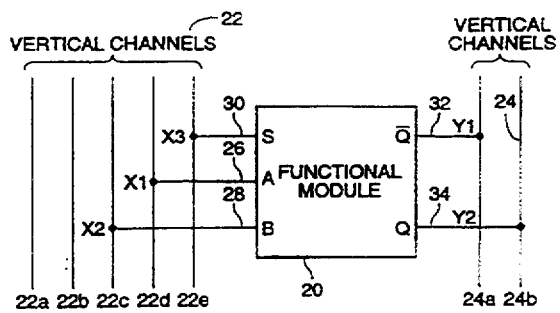

FIGURE 2A

In the drawings, Fig. 2C should appear as follows:

| LOGIC FUNCTIONS TO BE REALIZED | UNIVERSAL MODULE | | | | |
|---|---|---|---|---|---|
| | INPUT CONNECTIONS | | | OUTPUTS | |
| | S | A | B | $\bar{Q}$ | Q |
| NAND/AND | X | Y | '0' | $\overline{X \cdot Y}$ | $X \cdot Y$ |
| NOR/OR | X | '1' | Y | $\overline{X+Y}$ | $X+Y$ |
| XNOR/XOR | X | $\bar{Y}$ | Y | $X \cdot Y + \bar{X} \cdot \bar{Y}$ | $X \cdot \bar{Y} + \bar{X} \cdot Y$ |
| SR/LATCH | $\bar{Q}$ | S | $\bar{R}$ | $\bar{Q}$ | Q |
| D/LATCH | L | D | Q | $\bar{Q}$ | Q |

FIGURE 2C

UNITED STATES PATENT AND TRADEMARK OFFICE
CERTIFICATE OF CORRECTION

Page 4 of 11

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 2D should appear as follows:

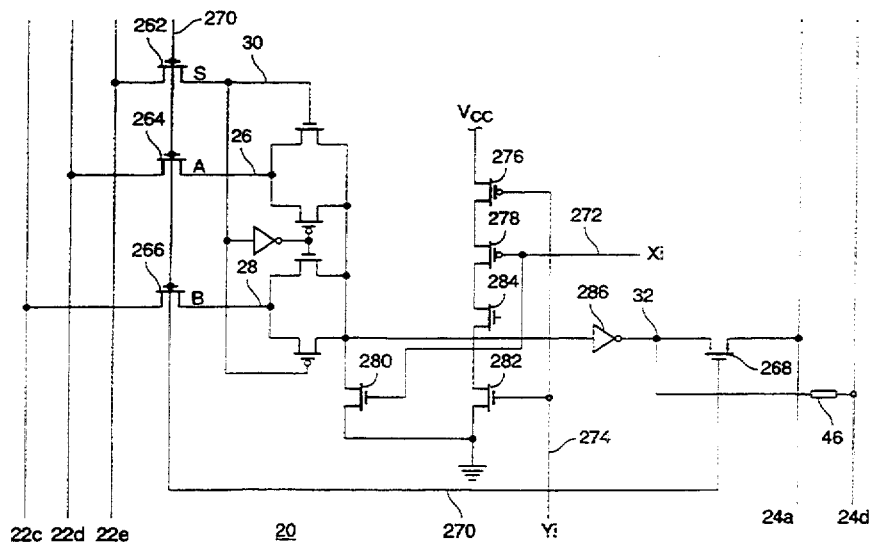

FIGURE 2D

UNITED STATES PATENT AND TRADEMARK OFFICE
CERTIFICATE OF CORRECTION

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 2F should appear as follows:

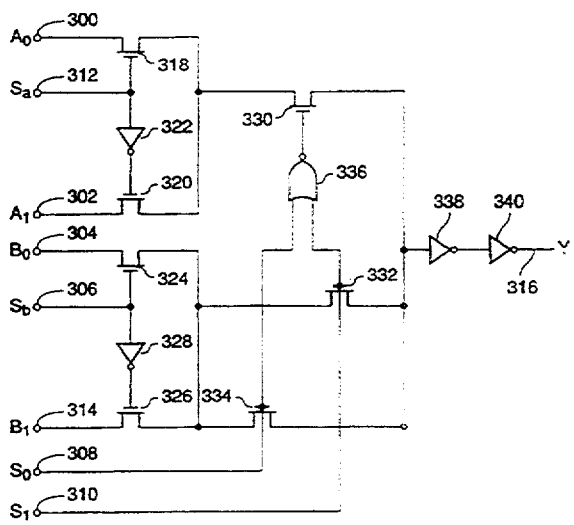

FIGURE 2F

UNITED STATES PATENT AND TRADEMARK OFFICE
CERTIFICATE OF CORRECTION

Page 6 of 11

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 4 should appear as follows:

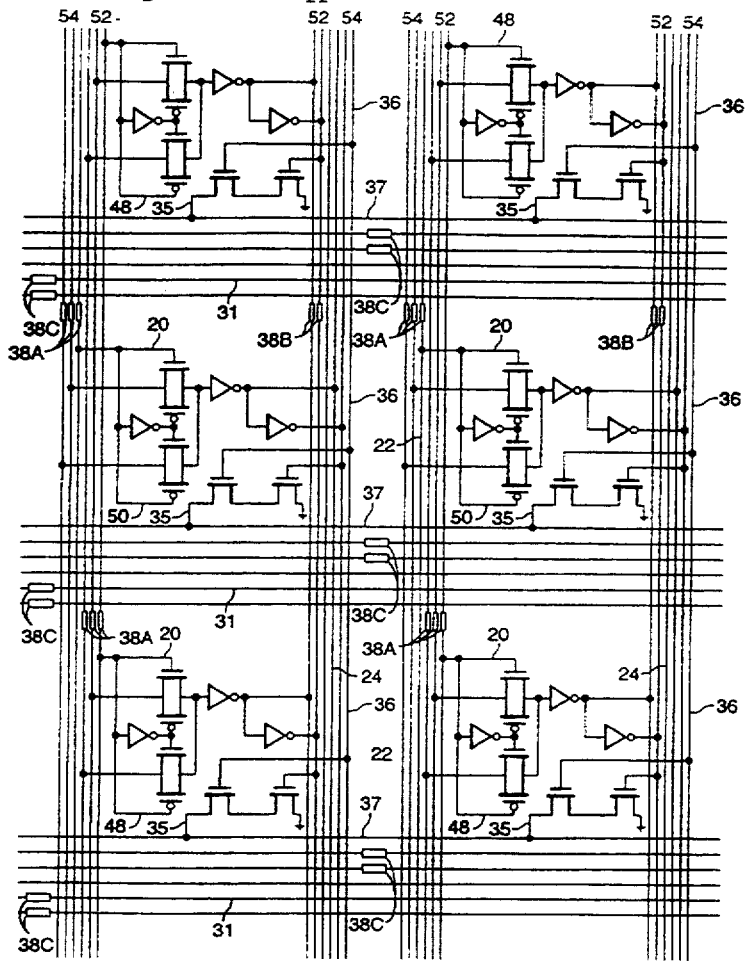

FIGURE 4

UNITED STATES PATENT AND TRADEMARK OFFICE
CERTIFICATE OF CORRECTION

Page 7 of 11

PATENT NO. : 4,910,417

DATED : March 20, 1990

INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 6 should appear as follows:

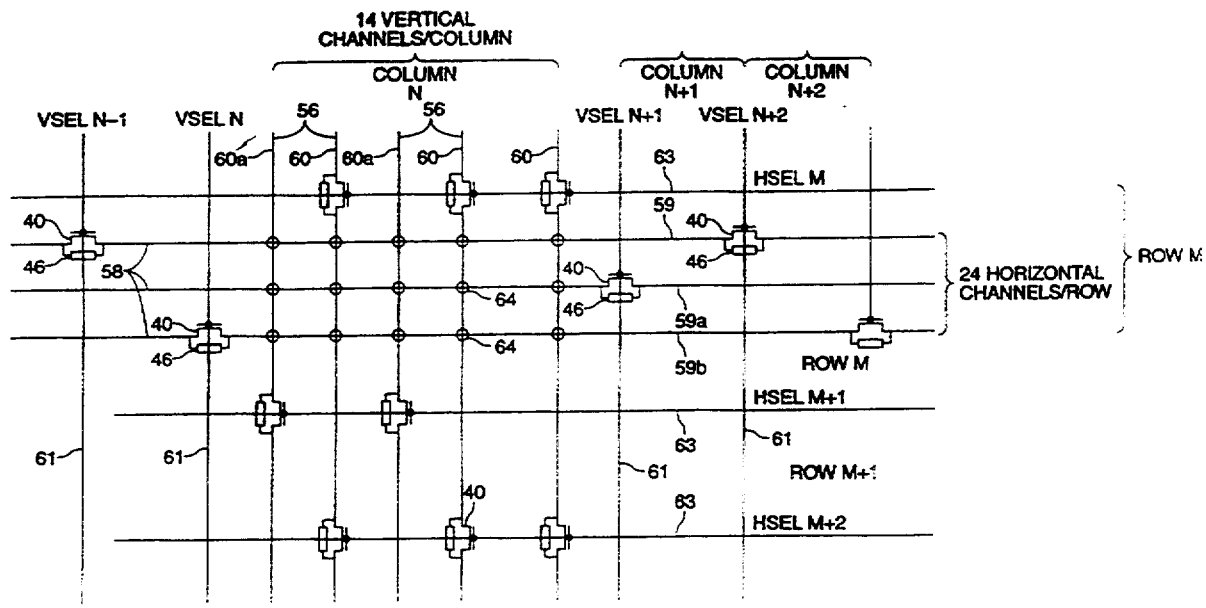

FIGURE 6

UNITED STATES PATENT AND TRADEMARK OFFICE
CERTIFICATE OF CORRECTION

Page 8 of 11

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 7D should appear as follows:

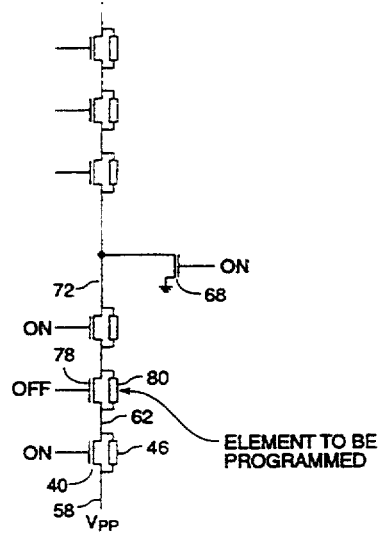

FIGURE 7D

UNITED STATES PATENT AND TRADEMARK OFFICE
CERTIFICATE OF CORRECTION

Page 9 of 11

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 7G should appear as follows:

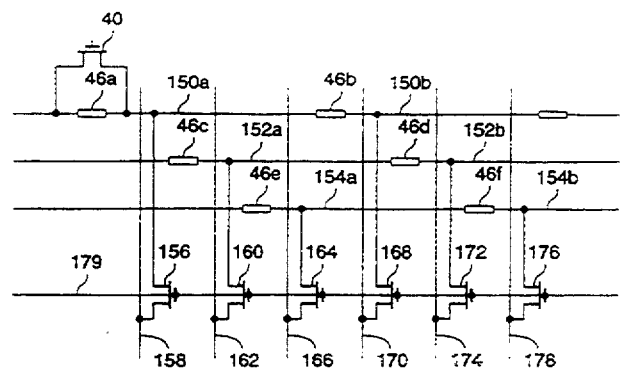

FIGURE 7G

UNITED STATES PATENT AND TRADEMARK OFFICE
CERTIFICATE OF CORRECTION

Page 10 of 11

PATENT NO. : 4,910,417
DATED : March 20, 1990
INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 7H should appear as follows:

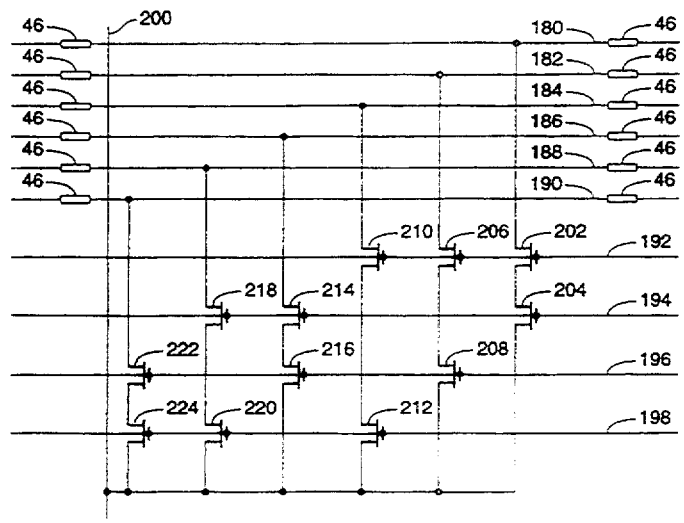

FIGURE 7H

UNITED STATES PATENT AND TRADEMARK OFFICE
CERTIFICATE OF CORRECTION

PATENT NO. : 4,910,417

DATED : March 20, 1990

INVENTOR(S) : Abbas El Gamal, Khaled A. El-Ayat, Jonathan W. Greene, Ta-Pen R. Guo It is certified that error appears in the above-indentified patent and that said Letters Patent is hereby corrected as shown below:

In the drawings, Fig. 10B should appear as follows:

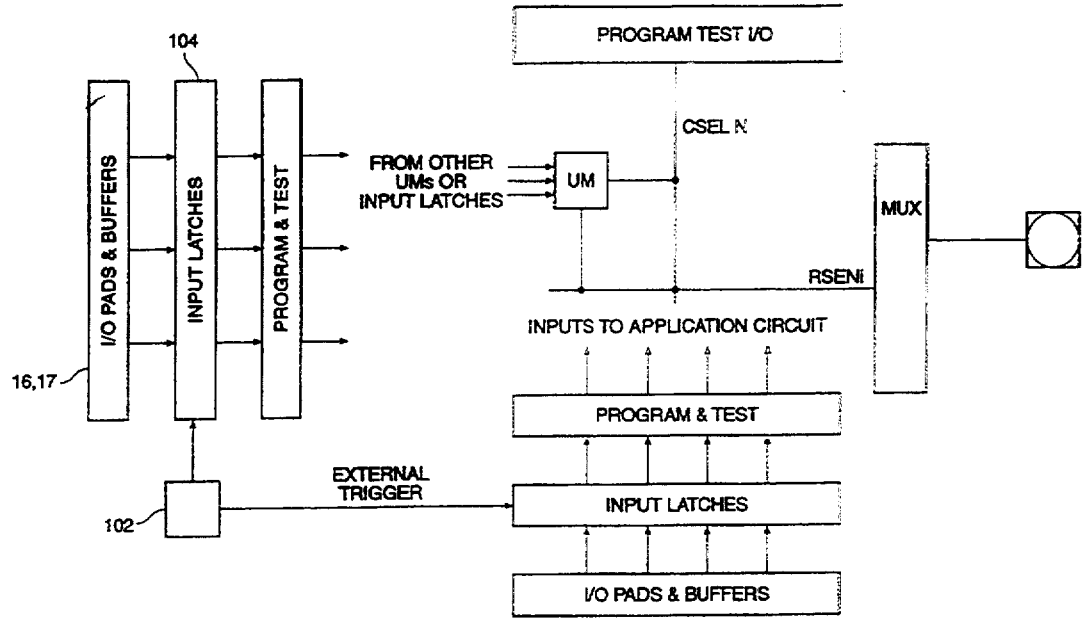

FIGURE 10B